United States Patent
Miyairi

(10) Patent No.: US 8,441,051 B2
(45) Date of Patent: May 14, 2013

(54) SEMICONDUCTOR DEVICE AND MANUFACTURING METHOD THEREOF

(75) Inventor: Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/517,879

(22) Filed: Jun. 14, 2012

(65) Prior Publication Data
US 2012/0248513 A1    Oct. 4, 2012

Related U.S. Application Data

(62) Division of application No. 12/717,313, filed on Mar. 4, 2010, now Pat. No. 8,202,769.

(30) Foreign Application Priority Data

Mar. 11, 2009   (JP) .................... 2009-057437

(51) Int. Cl.
   *H01L 29/76*       (2006.01)
(52) U.S. Cl.
   USPC .............. 257/288; 438/149; 438/151; 257/57
(58) Field of Classification Search ........... 438/155, 438/22, 149, 151; 257/57, 288, E29.255, 257/151
   See application file for complete search history.

(56) References Cited

U.S. PATENT DOCUMENTS

| | | | |
|---|---|---|---|
| 4,409,134 A | 10/1983 | Yamazaki |
| 6,008,065 A | 12/1999 | Lee et al. |
| 6,387,737 B1 | 5/2002 | Yamazaki et al. |
| 6,485,997 B2 | 11/2002 | Lee et al. |
| 6,493,048 B1 | 12/2002 | Baek et al. |
| 6,635,581 B2 | 10/2003 | Wong |
| 6,747,288 B2 | 6/2004 | Yamazaki et al. |
| 6,762,082 B2 | 7/2004 | Yamazaki et al. |
| 6,806,495 B1 | 10/2004 | Yamazaki et al. |
| 7,019,329 B2 | 3/2006 | Yamazaki et al. |
| 7,223,643 B2 | 5/2007 | Ohnuma et al. |

(Continued)

FOREIGN PATENT DOCUMENTS

| | | |
|---|---|---|
| JP | 64-084669 A | 3/1989 |
| JP | 03-011744 A | 1/1991 |

(Continued)

OTHER PUBLICATIONS

Kim et al., "A Novel Four-Mask-Count Process Architecture for TFT-LCDS," SID Digest '00: SID International Symposium Digest of Technical Papers, 2000, vol. 31, pp. 1006-1009.

*Primary Examiner* — Julio J Maldonado
*Assistant Examiner* — Robert Bachner
(74) *Attorney, Agent, or Firm* — Eric J. Robinson; Robinson Intellectual Property Law Office, P.C.

(57) ABSTRACT

A space is provided under part of a semiconductor layer. Specifically, a structure in which an eaves portion (a projecting portion, an overhang portion) is formed in the semiconductor layer. The eaves portion is formed as follows: a stacked-layer structure in which a conductive layer, an insulating layer, and a semiconductor layer are stacked in this order is etched collectively to determine a pattern of a gate electrode; and a pattern of the semiconductor layer is formed while side-etching is performed.

12 Claims, 38 Drawing Sheets

U.S. PATENT DOCUMENTS

| | | |
|---|---|---|
| 7,414,266 B2 | 8/2008 | Yamazaki et al. |
| 7,652,294 B2 | 1/2010 | Yamazaki et al. |
| 2001/0049064 A1 | 12/2001 | Lee et al. |
| 2005/0023528 A1 | 2/2005 | Yamazaki et al. |
| 2006/0290867 A1 | 12/2006 | Ahn et al. |
| 2007/0002249 A1 | 1/2007 | Yoo et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0222936 A1 | 9/2007 | Shih |
| 2008/0315208 A1 | 12/2008 | Yamazaki et al. |
| 2009/0152559 A1 | 6/2009 | Miyairi et al. |
| 2009/0212296 A1 | 8/2009 | Mizoguchi et al. |
| 2009/0212300 A1 | 8/2009 | Komori |
| 2009/0224249 A1 | 9/2009 | Miyairi et al. |
| 2009/0227051 A1 | 9/2009 | Miyairi et al. |
| 2009/0227076 A1 | 9/2009 | Miyairi et al. |
| 2009/0233389 A1 | 9/2009 | Miyairi et al. |
| 2009/0261369 A1 | 10/2009 | Komori et al. |
| 2009/0311809 A1 | 12/2009 | Miyairi et al. |
| 2010/0055852 A1* | 3/2010 | Ohtani et al. ............ 438/158 |

FOREIGN PATENT DOCUMENTS

| | | |
|---|---|---|
| JP | 03-161938 A | 7/1991 |
| JP | 07-307477 A | 11/1995 |
| JP | 2001-247350 A | 9/2001 |
| JP | 2001-250953 A | 9/2001 |
| JP | 2001-257350 A | 9/2001 |
| JP | 2003-179069 A | 6/2003 |
| JP | 2007-227440 A | 9/2007 |
| WO | WO 2008/099528 | 8/2008 |

* cited by examiner

SEMICONDUCTOR DEVICE AND MANUFACTURING METHOD THEREOF

BACKGROUND OF THE INVENTION

1. Field of the Invention

The technical field of the present invention rerates to a semiconductor device and a manufacturing method thereof.

2. Description of the Related Art

As a transistor, a bottom-gate transistor in which a gate electrode is provided under a semiconductor layer is known (Patent Document 1 and Patent Document 2).

REFERENCE

[Patent Document 1] Japanese Published Patent Application No. 2001-250953

[Patent Document 2] Japanese Published Patent Application No. 2001-257350

SUMMARY OF THE INVENTION

A bottom-gate transistor described in Patent Document 1 or Patent Document 2 is influenced by a step of a gate electrode in some cases because a semiconductor layer is formed after a pattern of the gate electrode is formed.

Therefore, a semiconductor device in which an influence of a step of a gate electrode is reduced, and a manufacturing method thereof are disclosed below.

An influence of a step of a gate electrode can be reduced using a structure in which a semiconductor layer does not cross an end portion (a step portion) of the gate electrode or a structure in which a space is provided under part of the semiconductor layer.

When a stacked-layer structure in which a conductive layer, an insulating layer, and the semiconductor layer are stacked in this order is processed by etching, a structure in which the semiconductor layer does not cross an end portion of a gate electrode or a structure in which a space is provided under part of a semiconductor layer can be formed.

In particular, the structure in which a space is provided under part of a semiconductor layer can be formed when a conductive layer which serves as a gate electrode is subjected to side-etching.

When the structure in which a semiconductor layer does not cross an end portion of a gate electrode is employed, there are serious limitations on the design of an integrated circuit.

Accordingly, the structure in which a space is provided under part of a semiconductor layer is superior to the structure in which a semiconductor layer does not cross an end portion of a gate electrode in that the limitations on design can be reduced significantly.

Note that the structure in which a space is provided under part of a semiconductor layer specifically refers to a structure in which an eaves portion (a projecting portion, an overhang portion) is formed in the semiconductor layer.

A semiconductor device is preferably manufactured by a method including the steps of: forming a stacked-layer structure including a first conductive layer, a first insulating layer provided over the first conductive layer, and a first semiconductor layer provided over the first insulating layer; forming a first mask including over the stacked-layer structure, which includes a thick film region and a thin film region having a thickness smaller than that of the thick film region; forming a second semiconductor layer, a second insulating layer, and a second conductive layer by etching the first semiconductor layer, the first insulating layer, and the first conductive layer using the first mask; forming an eaves portion in the second semiconductor layer and a gate electrode by side-etching the second conductive layer; forming a second mask by removing the thin film region in the first mask; forming a third semiconductor layer including an eaves portion by etching at least the second semiconductor layer using the second mask; and forming, at least, an impurity region in the eaves portion and a channel formation region in a position which overlaps the gate electrode by adding an impurity to the third semiconductor layer.

Further, a semiconductor device is preferably manufactured by a method including the steps of: forming a stacked-layer structure including a first conductive layer, a first insulating layer provided over the first conductive layer, and a first semiconductor layer provided over the first insulating layer; forming a first mask over the stacked-layer structure, which includes a thick film region and a thin film region having a thickness smaller than that of the thick film region; forming a second semiconductor layer, a second insulating layer, and a second conductive layer by etching the first semiconductor layer, the first insulating layer, and the first conductive layer using the first mask; forming an eaves portion in the second semiconductor layer, a gate electrode, and a column electrode which is electrically separated from the gate electrode by side-etching the second conductive layer; forming a second mask by removing the thin film region in the first mask; forming a third semiconductor layer including an eaves portion by etching at least the second semiconductor layer using the second mask; and forming, at least, an impurity region in a position which overlaps the eaves portion and the column electrode and a channel formation region in a position which overlaps the gate electrode by adding an impurity to the third semiconductor layer.

Further, it is preferable that a Lov region be formed in a position which overlaps the gate electrode and a Loff region be formed in the eaves portion of the third semiconductor layer by adding an impurity to the third semiconductor layer.

Further, a semiconductor device is preferably manufactured by a method including the steps of: forming a stacked-layer structure including a first conductive layer, a first insulating layer provided over the first conductive layer, and a first semiconductor layer provided over the first insulating layer; forming a first mask over the stacked-layer structure, which includes a thick film region and a thin film region having a thickness smaller than that of the thick film region; forming a second semiconductor layer, a second insulating layer, and a second conductive layer by etching the first semiconductor layer, the first insulating layer, and the first conductive layer using the first mask; forming an eaves portion in the second semiconductor layer and a gate electrode by side-etching the second conductive layer; forming a second mask by removing the thin film region in the first mask; forming a third semiconductor layer including an eaves portion by etching at least the second semiconductor layer using the second mask; and forming an impurity semiconductor layer over the eaves portion formed in the third semiconductor layer.

Further, a semiconductor device is preferably manufactured by a method including the steps of: forming a stacked-layer structure including a first conductive layer, a first insulating layer provided over the first conductive layer, and a first semiconductor layer provided over the first insulating layer; forming a first mask over the stacked-layer structure, which includes a thick film region and a thin film region having a thickness smaller than that of the thick film region; forming a second semiconductor layer, a second insulating layer, and a second conductive layer by etching the first semiconductor layer, the first insulating layer, and the first conductive layer using the first mask; forming an eaves portion in the second semiconductor layer, a gate electrode, and a column electrode which is electrically separated from the gate electrode by side-etching the second conductive layer; forming a second mask by removing the thin film region in the first mask; forming a third semiconductor layer including an eaves portion by etching at least the second semiconductor layer using the second mask; and forming an impurity semiconductor layer over the eaves portion formed in the third semiconductor layer and in a position which overlaps the column electrode.

Further, it is preferable that a Lov region be formed in a position which overlaps the gate electrode and a Loff region be formed in a position which overlaps the eaves portion of the third semiconductor layer by forming the impurity semiconductor layer.

Further, it is preferable that a semiconductor device include a gate electrode; a gate insulating layer provided over the gate electrode; and a semiconductor layer which is provided over the gate insulating layer and which includes an eaves portion. The semiconductor layer includes, at least, a channel formation region and an impurity region, the channel formation region is provided in a position which overlaps the gate electrode, and the impurity region is provided in the eaves portion.

Further, it is preferable that a column electrode electrically separated from the gate electrode be provided under the gate insulating layer and the column electrode be provided in a position which overlaps the impurity region.

Further, it is preferable that the impurity region include a Lov region formed in a position which overlaps the gate electrode and a Loff region formed in the eaves portion.

Further, it is preferable that a semiconductor device include a gate electrode; a gate insulating layer provided over the gate electrode; a semiconductor layer which is provided over the gate insulating layer and includes an eaves portion; and an impurity semiconductor layer provided over the semiconductor layer. The impurity semiconductor layer is provided in a position which overlaps the eaves portion.

Further, it is preferable that a column electrode electrically separated from the gate electrode be provided under the gate insulating layer, and the column electrode be provided in a position which overlaps the impurity semiconductor layer.

Further, it is preferable that the impurity semiconductor layer include a Lov region formed in a position which overlaps the gate electrode and a Loff region formed in the eaves portion.

An influence of a step of a gate electrode can be reduced using a structure in which a semiconductor layer does not cross an end portion of a gate electrode or a structure in which a space is provided under part of the semiconductor layer.

BRIEF DESCRIPTION OF THE DRAWINGS

In the accompanying drawings:

FIGS. 37A-1, 37A-2, 37B-1 and 37B-2 illustrate an example of a multi-tone mask.

DETAILED DESCRIPTION OF THE INVENTION

Figure 1:
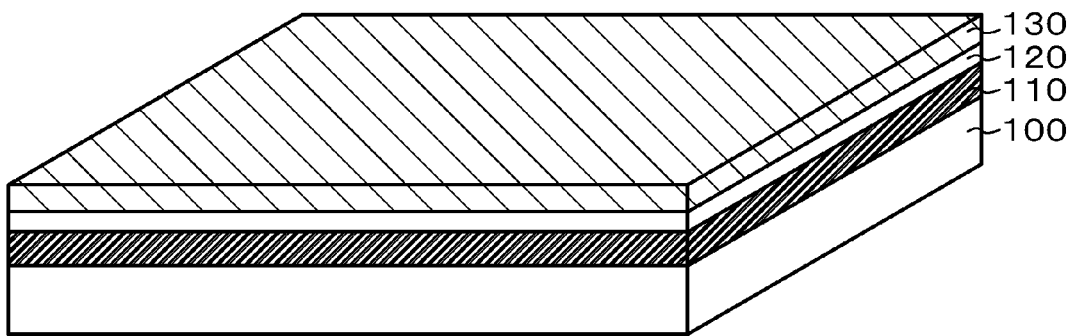
FIG. 1 illustrates an example of a method for manufacturing a semiconductor device.

Embodiments are described below.

It is easily understood by those skilled in the art that modes and details of the present invention can be modified in various ways without departing from the spirit of the present invention.

Therefore, the scope of the present invention should not be interpreted as being limited to the description of the embodiments given below.

Note that in the structures described below, the same portions or portions having similar functions are denoted by the same reference numerals in different drawings, and explanation thereof is not repeated.

In addition, the following embodiments can be combined with each other as appropriate.

Embodiment 1

In this embodiment, an example of a semiconductor device including a structure in which a semiconductor layer does not cross an end portion (a step portion) of a gate electrode, and an example of a manufacturing method thereof are described.

First, a stacked-layer structure in which a conductive layer 110, an insulating layer 120, and a semiconductor layer 130 are stacked in this order is provided over a substrate 100 having an insulating surface (FIG. 1).

As the substrate, any substrate can be used. For example, a glass substrate, a quartz substrate, a metal substrate, a plastic substrate, or a semiconductor substrate can be used, but the substrate is not limited to these examples.

In the case where an insulating substrate is used as the substrate, the substrate has an insulating surface.

On the other hand, in the case where a metal substrate, a semiconductor substrate, or the like is used as the substrate, the substrate can have an insulating surface when a base insulating layer is formed over the substrate.

Note that a base insulating layer may be formed over the substrate also in the case where an insulating substrate is used as the substrate.

As the base insulating layer, any layer having an insulating property can be used. For example, a silicon oxide film, a silicon nitride film, a silicon oxide film including nitrogen, a silicon nitride film including oxygen, an aluminum nitride film, an aluminum oxide film, a film obtained by oxidizing or nitriding a semiconductor layer or a film obtained by oxidizing or nitriding a semiconductor substrate can be used, but the base insulating layer is not limited to these examples. The base insulating layer may have a single-layer structure or a stacked-layer structure.

As the conductive layer, any layer having conductivity can be used. For example, aluminum, titanium, molybdenum, tungsten, gold, silver, copper, silicon, a variety of alloys, or a conductive oxide layer (typically, indium tin oxide and the like) can be used, but the conductive layer is not limited to these examples. The conductive layer may have a single-layer structure or a stacked-layer structure.

As the insulating layer, any layer having an insulating property can be used. For example, a silicon oxide film, a silicon nitride film, a silicon oxide film including nitrogen, a silicon nitride film including oxygen, an aluminum nitride film, an aluminum oxide film, a film obtained by oxidizing or nitriding a semiconductor layer or a film obtained by oxidizing or nitriding a semiconductor substrate can be used, but the insulating layer is not limited to these examples. The insulating layer may have a single-layer structure or a stacked-layer structure. Note that the insulating layer 120 serves as a gate insulating layer.

As the semiconductor layer, any layer which is semiconductive can be used. For example, silicon, silicon containing carbon, germanium, a silicon-germanium alloy, gallium arsenide, oxide semiconductor, or organic semiconductor can be used, but the semiconductor layer is not limited to these examples. The semiconductor layer may have a single-layer structure or a stacked-layer structure.

The semiconductor layer 130 may have any crystallinity. For example, amorphous, microcrystal, polycrystal, or single crystal semiconductor can be used, but the crystallinity is not limited to these kinds of crystallinity.

Figure 2:
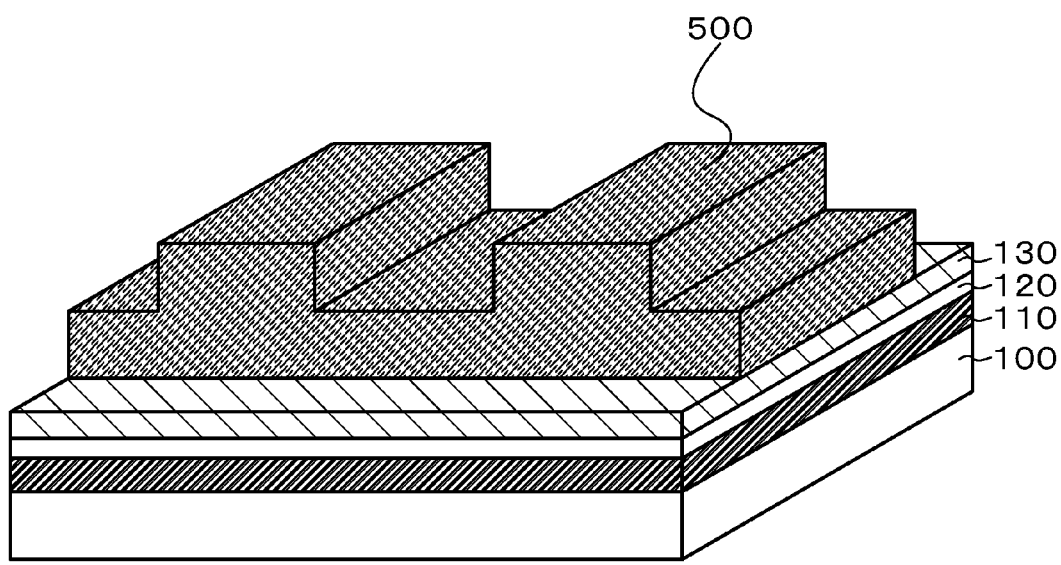
FIG. 2 illustrates an example of a method for manufacturing a semiconductor device.

Next, a mask 500 is provided over the semiconductor layer 130 (over the stacked-layer structure) (FIG. 2).

The mask 500 includes thick film regions (first regions, projections, regions with a large thickness) and thin film regions (second regions, depressions, regions with a small thickness).

The thick film region is a region having a thickness larger than that of the thin film region.

Note that a pattern of the thick film region is reflected in a pattern of the semiconductor layer and patterns of the thin film region and the thick film region are reflected in a pattern of the gate electrode.

Therefore, a pattern of the mask 500 is selected in order that a pattern of the entire mask is reflected in a pattern of a gate electrode.

Then, in the mask 500, the thick film region is placed in a position where the pattern of the semiconductor layer is to be formed.

As the mask 500, any mask including a thick film region and a thin film region can be used.

For example, a multi-tone mask made of a resist (also referred to as a half-tone mask, a gray-tone mask, or the like) can be used.

Alternatively, after a stack of plural kinds of films having different etching rates is formed, the stack may be processed by etching, so that a mask including a thick film region and a thin film region can be formed.

However, in view of reducing the number of steps, a multi-tone mask is preferably used.

Figure 3:
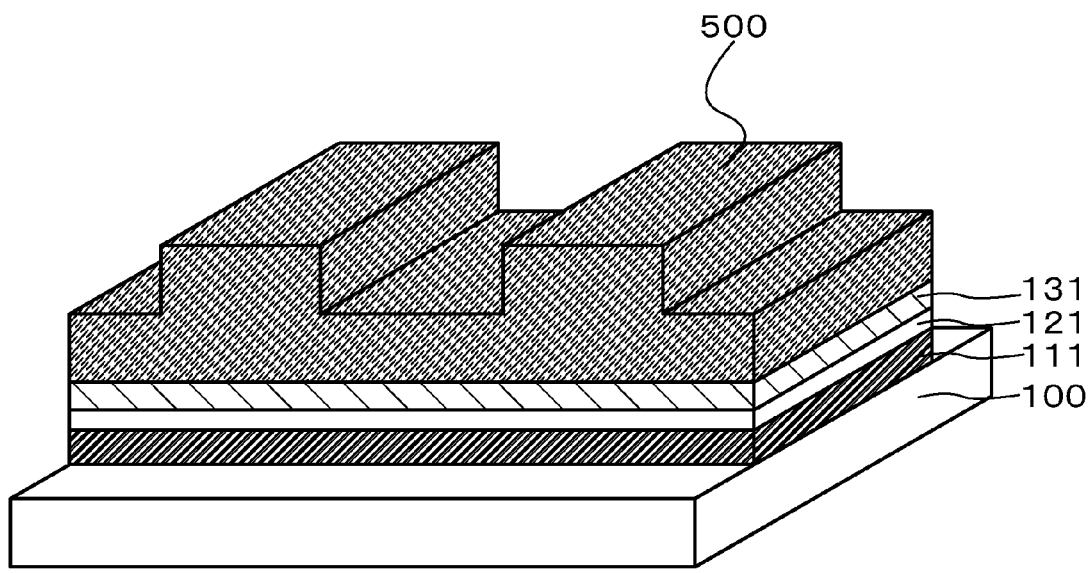
FIG. 3 illustrates an example of a method for manufacturing a semiconductor device.

Next, with the use of the mask 500, the semiconductor layer 130, the insulating layer 120, and the conductive layer 110 are sequentially etched to form a semiconductor layer 131, an insulating layer 121, a conductive layer 111 (a gate electrode) (FIG. 3).

Figure 4:
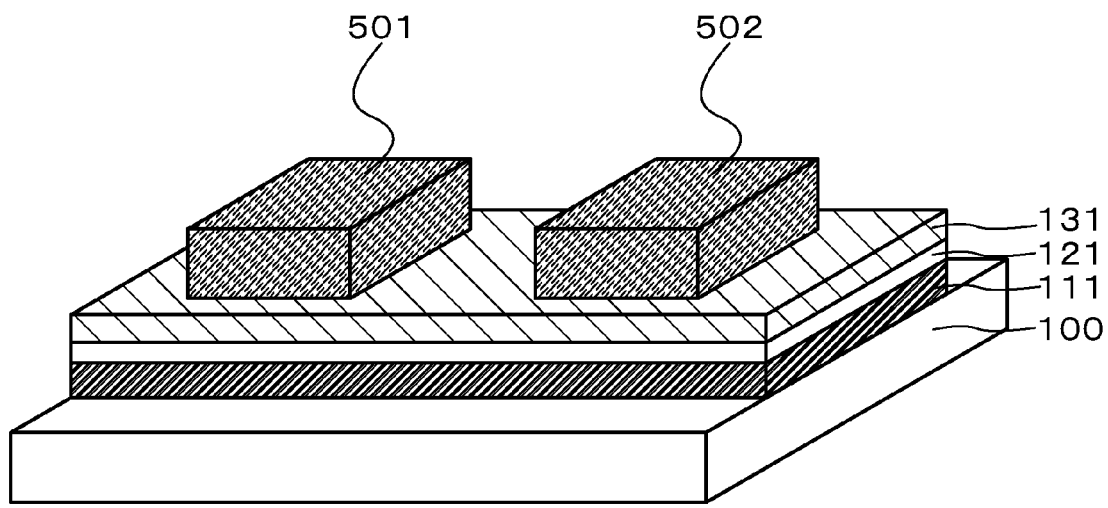
FIG. 4 illustrates an example of a method for manufacturing a semiconductor device.

Then, the thin film regions of the mask 500 are removed so that the thick film regions are left selectively; therefore, a mask 501 and a mask 502 are formed (FIG. 4).

For example, the thick film regions can be left by performing isotropic etching because the thin film regions disappear earlier than the thick film regions (for example, when a material of the mask 500 is an organic material such as a resist, oxygen plasma treatment may be performed).

Note that when isotropic etching is performed, the thick film regions are also etched; thus, a pattern of the thick film regions is slightly reduced in size (FIG. 4).

Next, the semiconductor layer 131 and the insulating layer 121 are etched using the mask 501 and the mask 502.

Figure 5A:
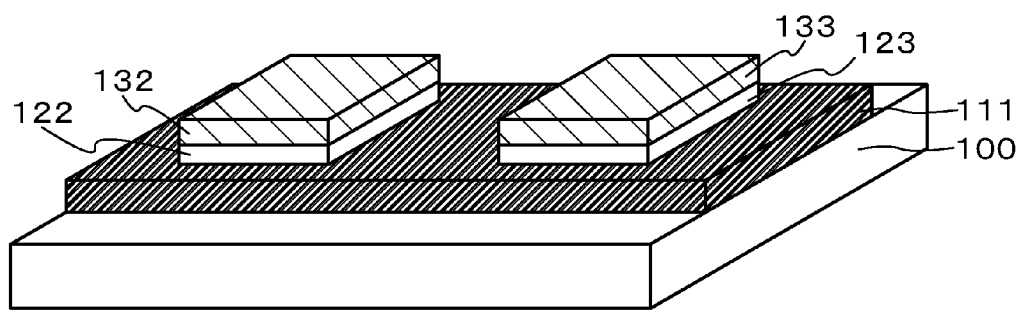
FIGS. 5A and 5B each illustrate an example of a method for manufacturing a semiconductor device.

By etching with the use of the mask 501 and the mask 502, a stacked-layer structure in which an insulating layer 122 and a semiconductor layer 132 are stacked in this order, and a stacked-layer structure in which an insulating layer 123 and a semiconductor layer 133 are stacked in this order are formed (FIG. 5A).

Figure 5B:
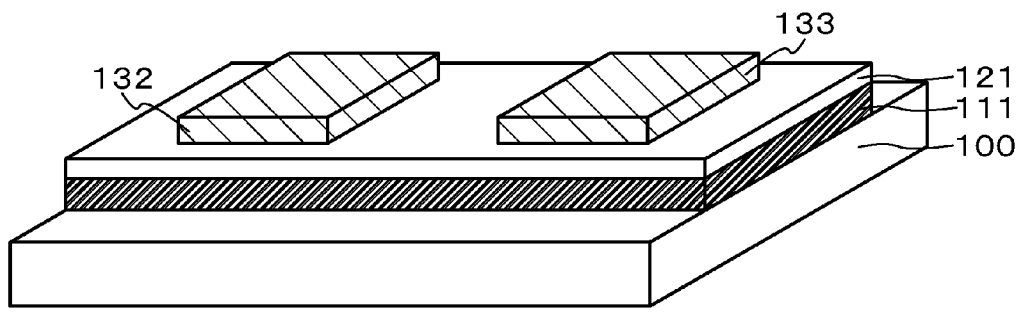

Note that although the insulating layer 121 is etched in FIG. 5A, the insulating layer 121 may be left as in FIG. 5B.

Figure 6A:
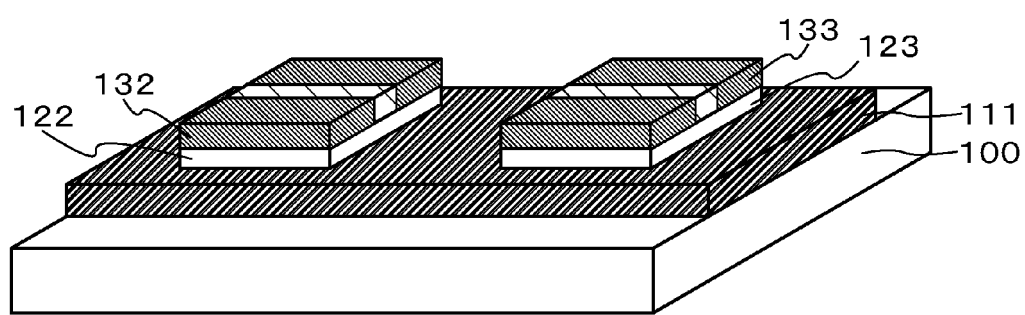
FIGS. 6A and 6B each illustrate an example of a method for manufacturing a semiconductor device.

Next, an impurity imparting conductivity is added to the semiconductor layer 132 and the semiconductor layer 133 to form an impurity region and a channel formation region (FIG. 6A).

The impurity imparting conductivity refers to an impurity including a donor element (e.g., phosphorus or arsenic) or an acceptor element (e.g., boron).

Note that in the case where an oxide semiconductor is used for the semiconductor layer, an element which causes oxygen deficiency (e.g., hydrogen) can be used as an impurity imparting conductivity.

The impurity regions may include at least high-concentration impurity regions (source regions and drain regions).

Low-concentration impurity regions (LDD (lightly doped drain) regions) may be formed in the impurity regions.

A high-concentration impurity region is a region having an impurity concentration higher than that in a low-concentration impurity region.

Figure 6B:
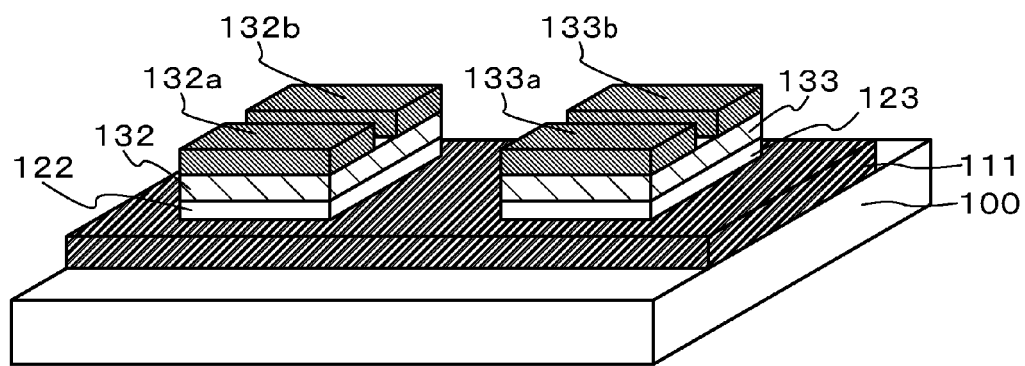

Note that although an impurity is added to the semiconductor layer in FIG. 6A, impurity semiconductor layers 132a and 132b and impurity semiconductor layers 133a and 133b may be formed over the semiconductor layer 132 and the semiconductor layer 133, respectively, as in FIG. 6B.

The impurity semiconductor layers may each have a single-layer structure or a stacked-layer structure.

Further, it is preferable to use both a donor element and an acceptor element because a CMOS circuit can be formed.

Figure 7:
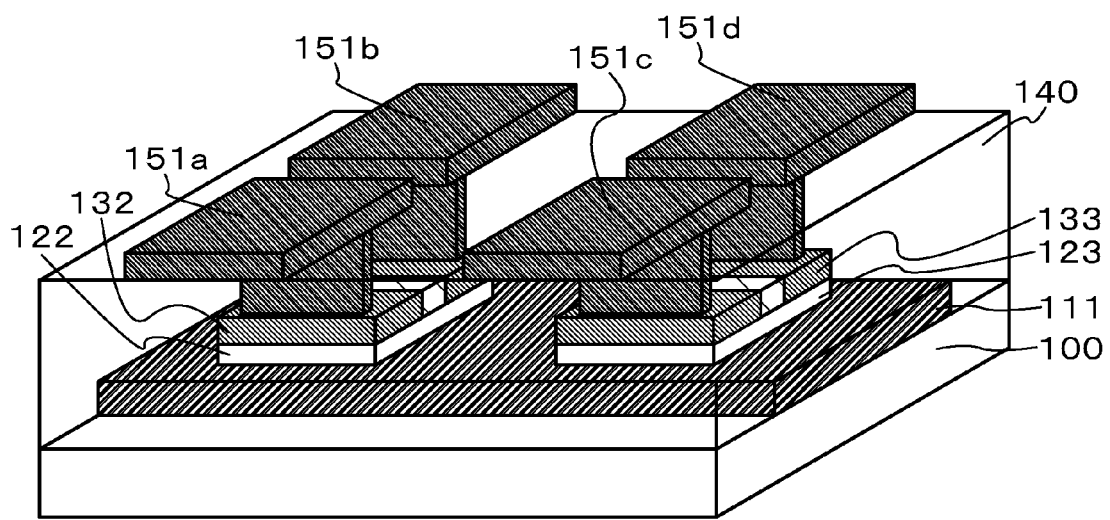
FIG. 7 illustrates an example of a method for manufacturing a semiconductor device.

Next, an interlayer insulating film 140 is formed, contact holes are formed in the interlayer insulating film 140, and wirings 151a to 151d electrically connected to the semiconductor layers through the contact holes are formed over the interlayer insulating film 140 (FIG. 7).

In addition, a wiring electrically connected to a gate electrode of another transistor through the contact hole may be formed simultaneously.

As the interlayer insulating film, any film having an insulating property can be used. For example, a silicon oxide film, a silicon nitride film, a silicon oxide film containing nitrogen, a silicon nitride film containing oxygen, an aluminum nitride film, an aluminum oxide film, a film obtained by oxidizing or nitriding a semiconductor layer, or a film obtained by oxidizing or nitriding a semiconductor substrate can be used, but the interlayer insulating film is not limited to these examples. The interlayer insulating film may have a single-layer structure or a stacked-layer structure.

As the wiring, any wiring having conductivity can be used. For example, aluminum, titanium, molybdenum, tungsten, gold, silver, copper, silicon, a variety of alloys, a conductive oxide layer (typically an indium tin oxide), or the like can be used, but the wiring is not limited to these examples. The wiring may have a single-layer structure or a stacked-layer structure.

As described above, an influence of a step of the gate electrode can be reduced by using the structure in which the pattern of the semiconductor layer does not cross an end portion (a step portion, an edge) of the pattern of the gate electrode.

The influence of a step of a gate electrode refers to, for example, a problem of edge leakage in the case where a semiconductor layer of a transistor is formed to cover the step portion, or a problem of disconnection in the case where a semiconductor layer is formed in the step portion.

For example, an insulating layer and a semiconductor layer may be formed after a pattern of a gate electrode is formed, as long as the pattern of the semiconductor layer does not cross an end portion (a step portion, an edge) of the pattern of the gate electrode.

However, in view of reducing the number of steps, it is preferable that as an example described in this embodiment, a stacked-layer structure in which a conductive layer, an insulating layer, and a semiconductor layer are stacked in this order be etched collectively to determine a pattern of a gate electrode, and after that a pattern of the semiconductor layer be formed.

This embodiment can be combined with any of the other embodiments.

Embodiment 2

When a structure in which a semiconductor layer does not cross an end portion of a gate electrode is employed as in Embodiment 1, there are serious limitations on the design of an integrated circuit.

In this embodiment, a semiconductor device of which the limitations on design can be reduced significantly as compared with those of a semiconductor device having a structure in which a semiconductor layer does not cross an end portion of a gate electrode, and a manufacturing method thereof are described.

First, the structure of FIG. 3 described in Embodiment 1 is formed.

Figure 8:
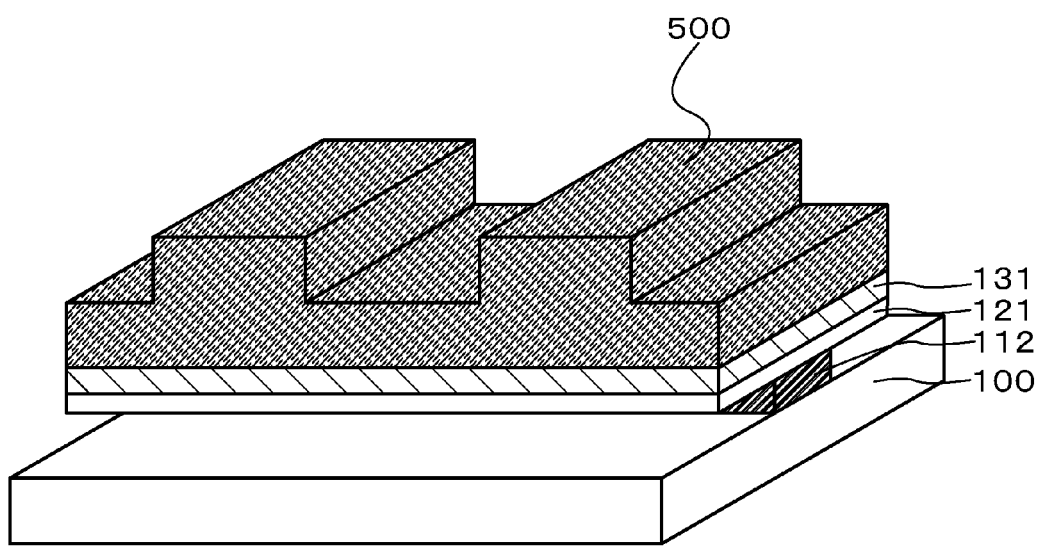
FIG. 8 illustrates an example of a method for manufacturing a semiconductor device.

Next, the conductive layer 111 is side-etched to form a conductive layer 112 (a gate electrode) (FIG. 8).

The conductive layer is side-etched when a material used for the conductive layer is subjected to isotropic etching.

Although isotropic etching is performed by wet etching in general, isotropic etching can also be performed by dry etching when a bias condition and the like are selected as appropriate.

A space (a cavity, a hollow) is formed in a portion where the conductive layer is removed by the side-etching; therefore, a space is provided under part of the insulating layer 121 and the semiconductor layer 131, which overlaps that portion.

Note that a cross-sectional shape of the semiconductor layer (or the insulating layer) is formed into an eaves-like shape (a projecting shape, an overhang shape) by the side-etching.

Therefore, the semiconductor layer (or the insulating layer) provided in the position which overlaps the space is referred to an eaves portion, a projecting portion, an overhang portion, or the like.

Note that a structure in which only the semiconductor layer is left in a portion overlapping the space may be formed by side-etching the insulating layer 121.

However, the semiconductor layer left in a portion overlapping the space has weak intensity and is easily broken.

Therefore, it is preferable that the insulating layer be not side-etched because the semiconductor layer and the insulating layer left in a portion overlapping the space can be supported by each other when the insulating layer is left.

Figure 9:
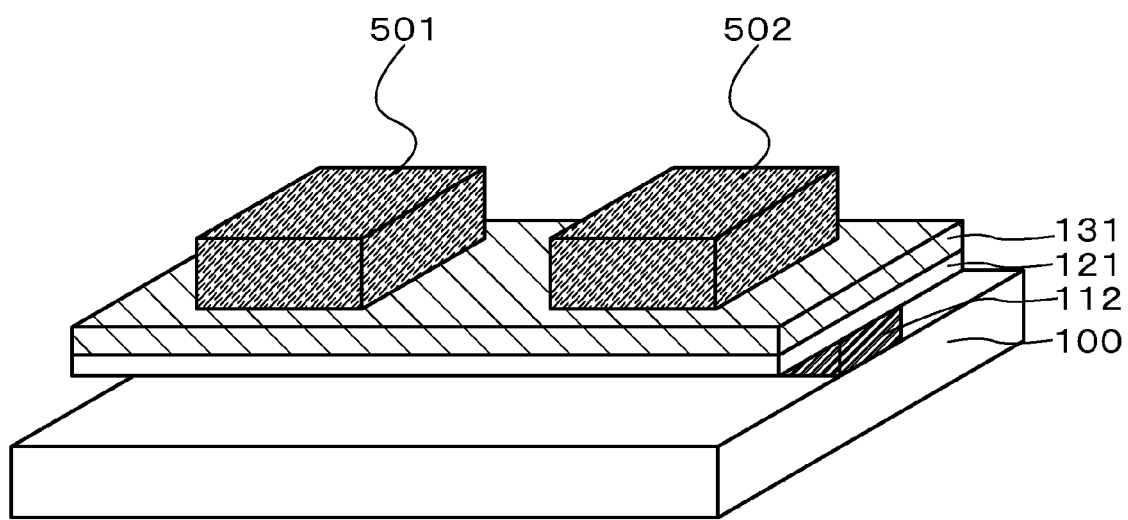
FIG. 9 illustrates an example of a method for manufacturing a semiconductor device.

Then, the thin film regions of the mask 500 are removed so that the thick film regions are left selectively; therefore, a mask 501 and a mask 502 are formed (FIG. 9).

For example, the thick film regions can be left by performing isotropic etching because the thin film regions disappear earlier than the thick film regions (for example, when a material of the mask 500 is an organic material such as a resist, oxygen plasma treatment may be performed).

Note that when isotropic etching is performed, the thick film regions are also etched; thus, a pattern of the thick film regions is slightly reduced in size (FIG. 9).

Figure 10A:
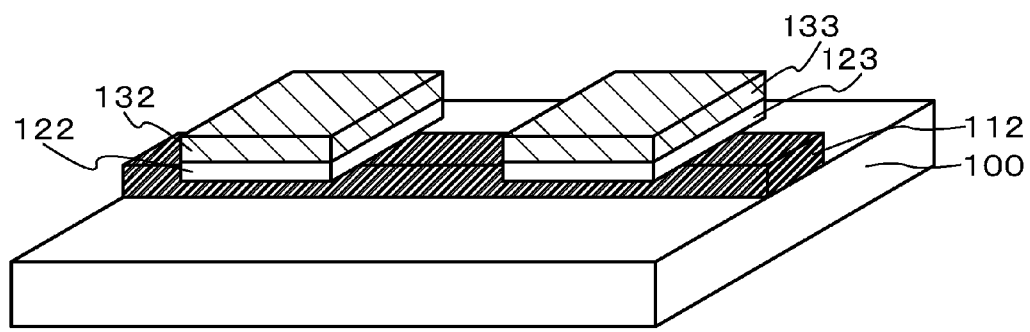
FIGS. 10A and 10B each illustrate an example of a method for manufacturing a semiconductor device.

Next, the semiconductor layer 131 and the insulating layer 121 are etched using the mask 501 and the mask 502 to form a stacked-layer structure in which an insulating layer 122 and a semiconductor layer 132 are stacked in this order, and a stacked-layer structure in which an insulating layer 123 and a semiconductor layer 133 are stacked in this order (FIG. 10A).

Figure 10B:
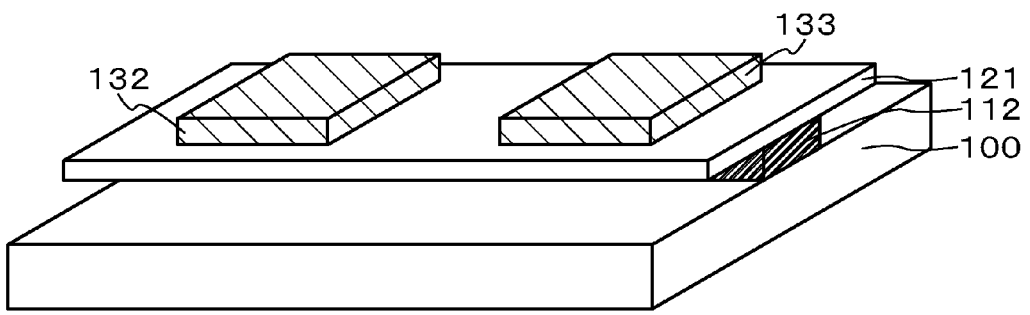

Note that although the insulating layer 121 is etched and removed in FIG. 10A, the insulating layer 121 may be left as in FIG. 10B.

Figure 11A:
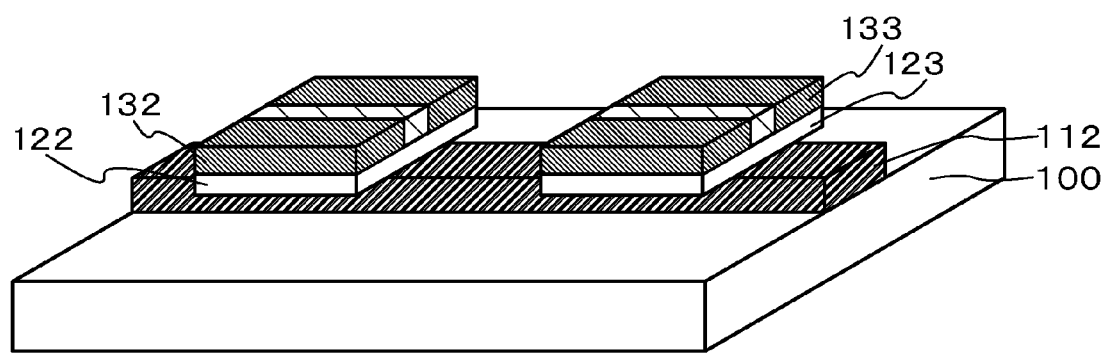
FIGS. 11A and 11B each illustrate an example of a method for manufacturing a semiconductor device.

Next, an impurity imparting conductivity is added to the semiconductor layer 132 and the semiconductor layer 133 to form impurity regions and channel formation regions (FIG. 11A).

The impurity regions may include at least high-concentration impurity regions (source regions and drain regions).

Low-concentration impurity regions (LDD (lightly doped drain) regions) may be formed in the impurity regions.

Note that although an impurity is added to the semiconductor layer in FIG. 11A, impurity semiconductor layers 132a and 132b and impurity semiconductor layers 133a and 133b may be formed over the semiconductor layer 132 and the semiconductor layer 133, respectively, as in FIG. 1B.

Further, it is preferable to use both a donor element and an acceptor element because a CMOS circuit can be formed.

In Embodiment 1, the gate electrode is in a position which overlaps the impurity regions.

Figure 11B:
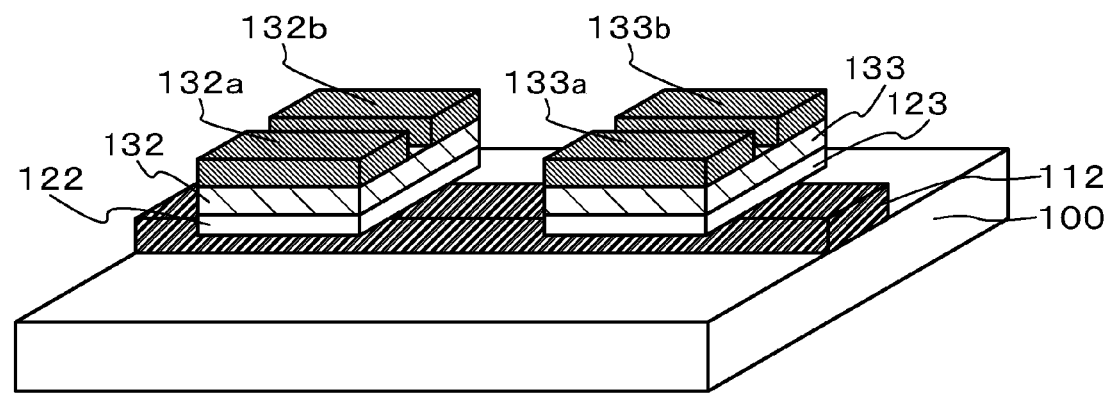

On the other hand, in FIGS. 11A and 11B, part or all of the impurity regions are formed in the eaves portions; therefore, the impurity regions can be formed in positions each of which does not overlap the gate electrode.

The impurity regions can be formed in the positions each of which does not overlap the gate electrode; thus, there is no influence of an unnecessary electric field on the impurity regions when a transistor is driven. In particular, an end portion of a drain (or an end portion of a source) is not applied by an unnecessary electric field; thus, electric-field concentration at the end portion of the drain (or the end portion of the source) can be prevented.

For example, when a gate electrode is in a position which overlaps a high-concentration impurity region, switching characteristics of a transistor is distorted because unnecessary parasitic capacitance is generated.

Further, there is a large difference in operation of a transistor depending on whether a low-concentration impurity region overlaps a gate electrode or not.

In the case of a structure where a low-concentration impurity region overlaps a gate electrode (a Lov region), there is an advantage that influence of hot carrier deterioration can be reduced, whereas there is a disadvantage that an off current is increased.

On the other hand, in the case of a structure where a low-concentration impurity region does not overlap a gate electrode (a Loff region), an off current can be reduced.

In particular, in the structure of Embodiment 1, the entire semiconductor layer overlaps the gate electrode; therefore, a Lov region can be formed while a Loff region cannot be formed.

On the other hand, the structure in this embodiment is superior to that in Embodiment 1 because a Loff region can also be formed.

In particular, both a Lov region and a Loff region are preferably formed because the presence of the Loff region can make up for the disadvantage of the Lov region.

Figure 12:
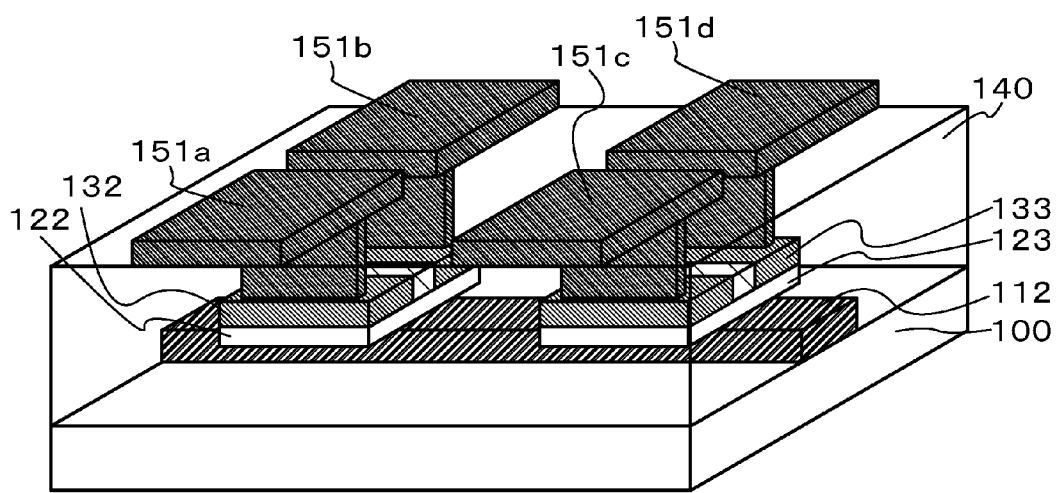
FIG. 12 illustrates an example of a method for manufacturing a semiconductor device.

Next, an interlayer insulating film 140 is formed, contact holes are formed in the interlayer insulating film 140, and wirings 151a to 151d electrically connected to the semiconductor layers through the contact holes are formed over the interlayer insulating film 140 (FIG. 12).

In addition, a wiring electrically connected to a gate electrode of another transistor through the contact hole may be formed simultaneously.

As the interlayer insulating film, any film having an insulating property can be used. For example, a silicon oxide film, a silicon nitride film, a silicon oxide film containing nitrogen, a silicon nitride film containing oxygen, an aluminum nitride film, an aluminum oxide film, a film obtained by oxidizing or nitriding a semiconductor layer, or a film obtained by oxidizing or nitriding a semiconductor substrate can be used, but the interlayer insulating film is not limited to these examples. The interlayer insulating film may have a single-layer structure or a stacked-layer structure.

As the wiring, any wiring having conductivity can be used. For example, aluminum, titanium, molybdenum, tungsten, gold, silver, copper, silicon, a variety of alloys, a conductive oxide layer (typically an indium tin oxide), or the like can be used, but the wiring is not limited to these examples. The wiring may have a single-layer structure or a stacked-layer structure.

As described above, when the gate electrode is side-etched to form the eaves portion in the semiconductor layer, there is no influence of the shape of the gate electrode on the shape of the semiconductor layer; therefore, influence of a step of the gate electrode can be reduced.

The influence of a step of a gate electrode refers to a problem of edge leakage in the case where a semiconductor layer of a transistor is formed to cover the step portion, a problem of disconnection in the case where semiconductor layer is formed in the step portion, or the like.

Note that in view of reducing the number of steps, it is preferable that as an example described in this embodiment, a stacked-layer structure in which a conductive layer, an insulating layer, and a semiconductor layer are stacked in this order be etched collectively to determine a pattern of a gate electrode, and after that a pattern of the semiconductor layer be formed while side-etching be performed, because the number of masks is not increased.

This embodiment can be combined with any of the other embodiments.

Embodiment 3

In FIG. 1 to FIG. 12, an example in which a plurality of transistors has a common gate electrode is illustrated.

For example, in the case where a circuit in which a plurality of transistors has a common gate electrode is formed as an active matrix display device provided with a plurality of gate wirings and a plurality of signal lines, a gate electrode is preferably shared in a manner as in FIG. 1 to FIG. 12. This is because the area occupied by the gate electrode (a gate wiring is also included) and the transistors can be reduced, and thus, an aperture ratio can be improved.

Figure 13A:
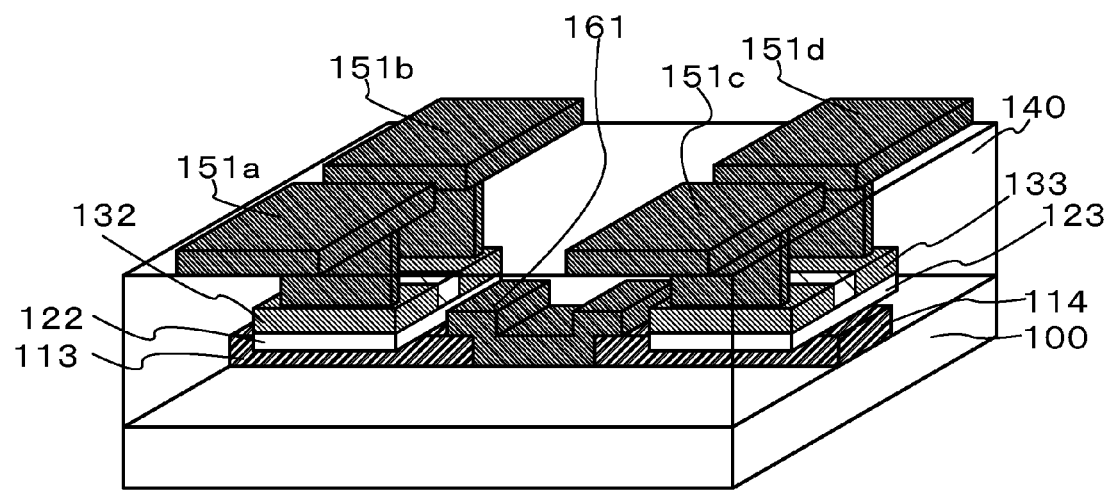
FIGS. 13A and 13B each illustrate an example of a method for manufacturing a semiconductor device.

Note that connection with the gate electrode may be made through a wiring 161 formed over the substrate and electrically connected to the gate electrode as in FIG. 13A.

The wiring 161 may be formed at any step after the formation of the gate electrode and the semiconductor layer using the mask 500 and before the formation of the interlayer insulating film.

In other words, the wiring 161 can be formed as appropriate before or after a step of adding an impurity element, or before or after a step of forming the impurity semiconductor layer, and the like (in the case of adding an impurity a plurality of times or the case of forming a plurality of impurity semiconductor layers, the wiring 161 may be formed during these steps).

Figure 13B:
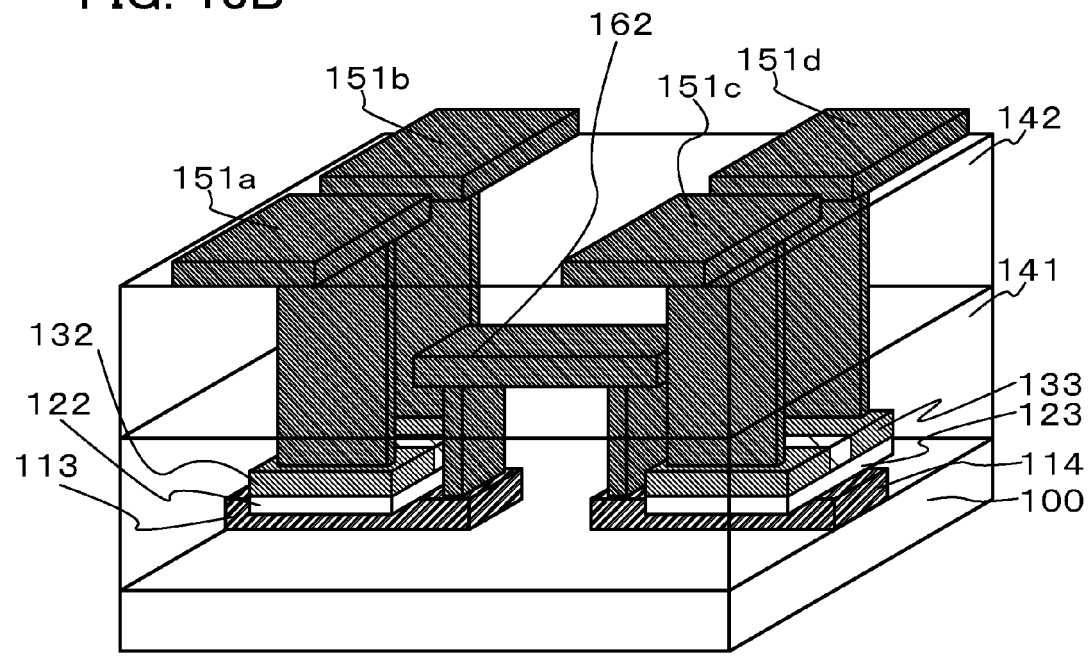

Alternatively, connection with the gate electrode may be made through a wiring 162 which is formed over an interlayer insulating film 141 including contact holes and which is electrically connected to the gate electrode through the contact holes as in FIG. 13B.

In FIG. 13B, an interlayer insulating film 142 including contact holes is provided over the interlayer insulating film 141, and the wirings 151a to 151d are formed over the interlayer insulating film 142.

The structure of FIG. 13B can be manufactured as follows: the interlayer insulating film 141 is formed over the semiconductor layers 132 and 133; the contact holes are formed in the interlayer insulating film 141; the wiring 162 is formed over the interlayer insulating film 141; the interlayer insulating film 142 is formed over the wiring 162; the contact holes are formed in the interlayer insulating films 142 and 141, and the wirings 151a to 151d are formed over the interlayer insulating film 142.

As in FIG. 1 to FIGS. 13A and 13B, when a wiring for electrically connecting gate electrodes is provided in a different layer from the layer in which the wirings 151a to 151d are formed, the wiring for electrically connecting gate electrodes and a wiring for electrically connecting semiconductor layers can be provided so as to intersect with each other.

Accordingly, the structures of FIG. 1 to FIGS. 13A and 13B are preferably used for a semiconductor device like an active matrix display device in which gate wirings and signal lines are formed to intersect with each other.

Note that a wiring electrically connected to the gate electrode may be formed at the same time as the formation of the wirings 151a to 151d.

As the wiring, any wiring having conductivity can be used. For example, aluminum, titanium, molybdenum, tungsten, gold, silver, copper, silicon, a variety of alloys, a conductive oxide layer (typically an indium tin oxide), or the like can be used, but the wiring is not limited to these examples. The wiring may have a single-layer structure or a stacked-layer structure.

In particular, in the case of forming a display device, a transparent conductive layer using indium tin oxide, zinc oxide, or the like is used for the wiring 161 or the wiring 162, and the portion where the wiring 161 or the wiring 162 is formed transmits light; thus, an aperture ratio can be increased.

This embodiment can be combined with any of the other embodiments.

Embodiment 4

In this embodiment, a shape of the mask 500 used in side-etching is described.

Figure 14A:
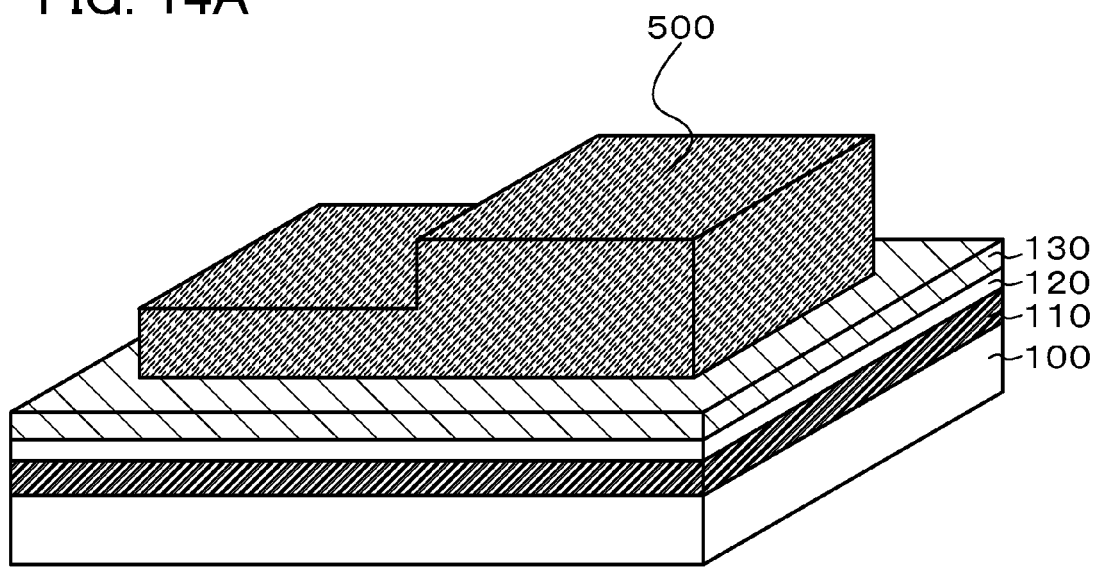
FIGS. 14A and 14B illustrate an example of a method for manufacturing a semiconductor device.

A connecting portion of the gate electrode and another wiring can be formed when the mask 500 has at least one thin film region as in FIG. 14A.

That is, the mask 500 should have at least one thick film region and one thin film region.

Figure 14B:
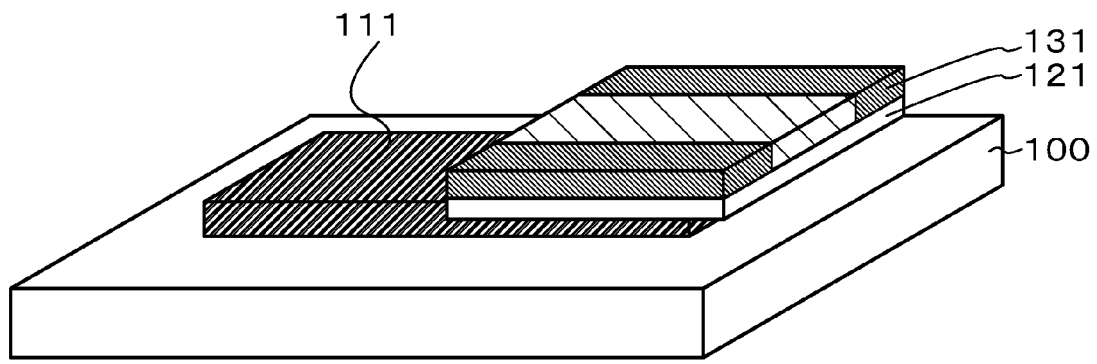

However, when side-etching is performed using a mask with a shape of FIG. 14A, a portion where the gate electrode does not exist under the channel formation region is generated as in FIG. 14B.

Figure 15A:
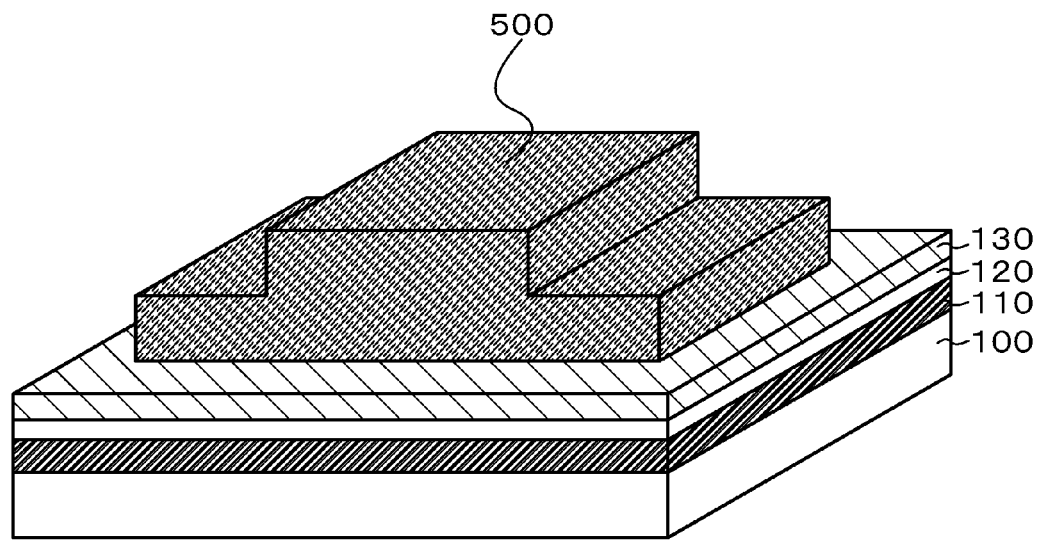
FIGS. 15A and 15B illustrate an example of a method for manufacturing a semiconductor device.

Accordingly, it is preferable that a pair of thin film regions be formed with a thick film region therebetween as in FIG. 15A, and addition of an impurity or formation of an impurity semiconductor layer be performed in order that a direction perpendicular to the direction in which the pair of thin film regions and the thick film region are placed is a channel length direction (a direction perpendicular to the direction in which a carrier flows).

Figure 15B:
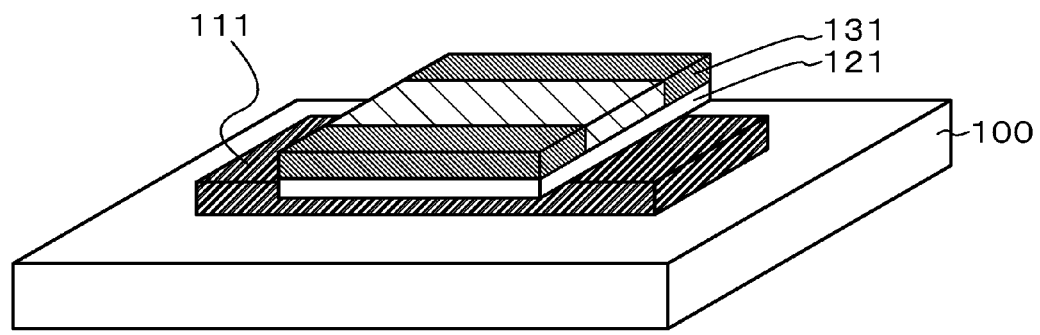

With the structure of FIGS. 15A and 15B, a portion where the gate electrode does not exist under the channel formation region is not generated even when side-etching is performed.

Note that when the structure of FIGS. 15A and 15B is employed, both sides of the gate electrode stick out (a projecting shape) in a channel width direction (a direction perpendicular to the channel length direction, a direction perpendicular to the direction in which a carrier flows).

This embodiment can be combined with any of the other embodiments.

Embodiment 5

In the other embodiments, the advantages of forming the structure in which a space is provided under part of a semiconductor layer by performing side-etching are described.

However, there is a disadvantage that peeling is likely to occur in a portion of a semiconductor layer under which a space is provided (an eaves portion).

Note that peeling refers to a defect of film removal.

Because a state where a film is removed is similar to a state where a peel is taken off, such a defect is often called peeling.

In this embodiment, a structure by which peeling is prevented as much as possible, and a manufacturing method thereof are described.

Figure 16:
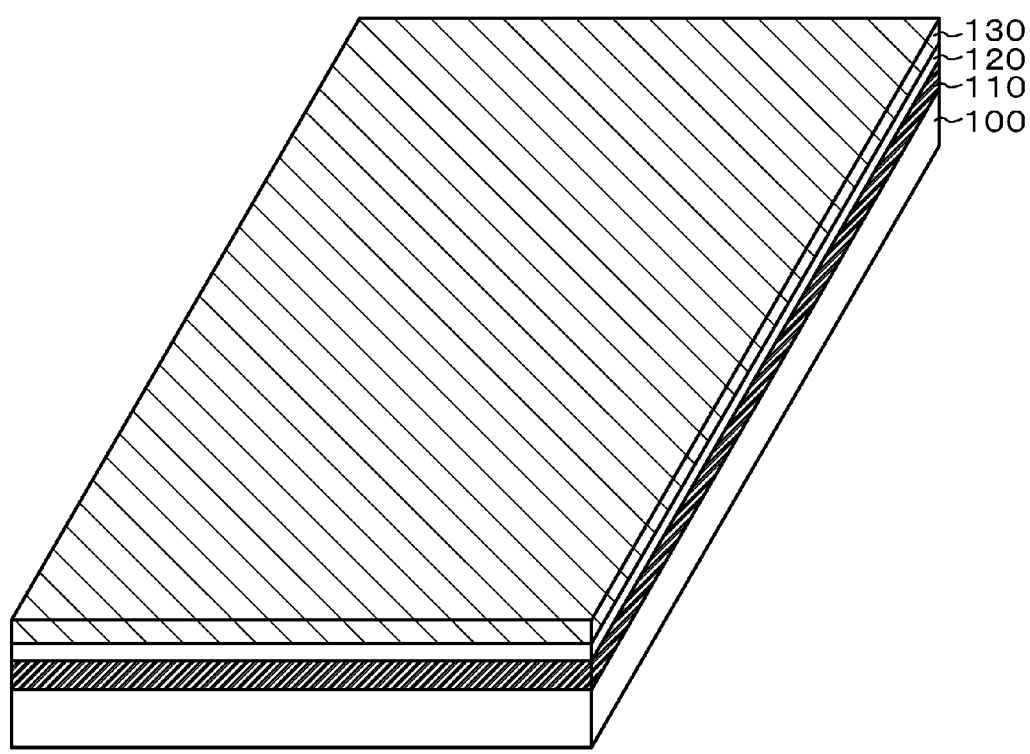
FIG. 16 illustrates an example of a method for manufacturing a semiconductor device.

First, a stacked-layer structure in which a conductive layer 110, an insulating layer 120, and a semiconductor layer 130 are stacked in this order is provided over a substrate 100 having an insulating surface (FIG. 16).

Figure 17A:
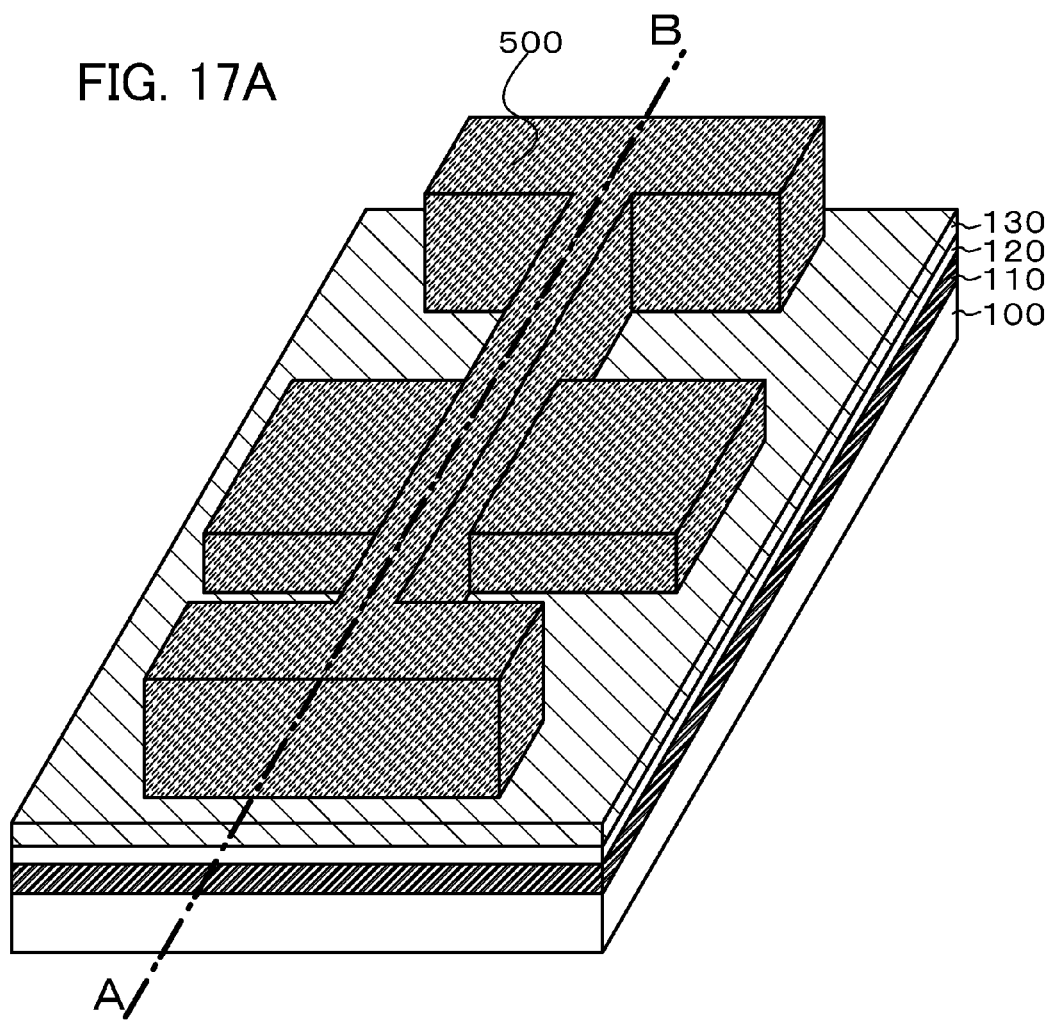
FIGS. 17A and 17B illustrate an example of a method for manufacturing a semiconductor device.
Figure 17B:
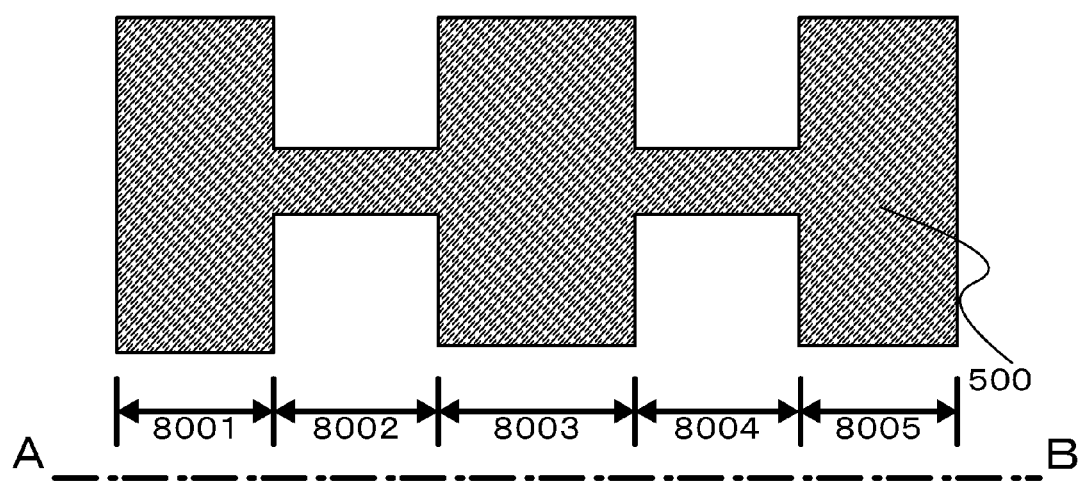

Next, a mask 500 is formed over the semiconductor layer 130 (FIGS. 17A and 17B).

Note that FIG. 17B is a top view of the mask 500 of FIG. 17A.

The mask 500 illustrated in FIGS. 17A and 17B is a mask in which a first region 8001 and a fifth region 8005 are added to the mask 500 illustrated in FIG. 2, FIG. 15A, or the like.

Figure 18:
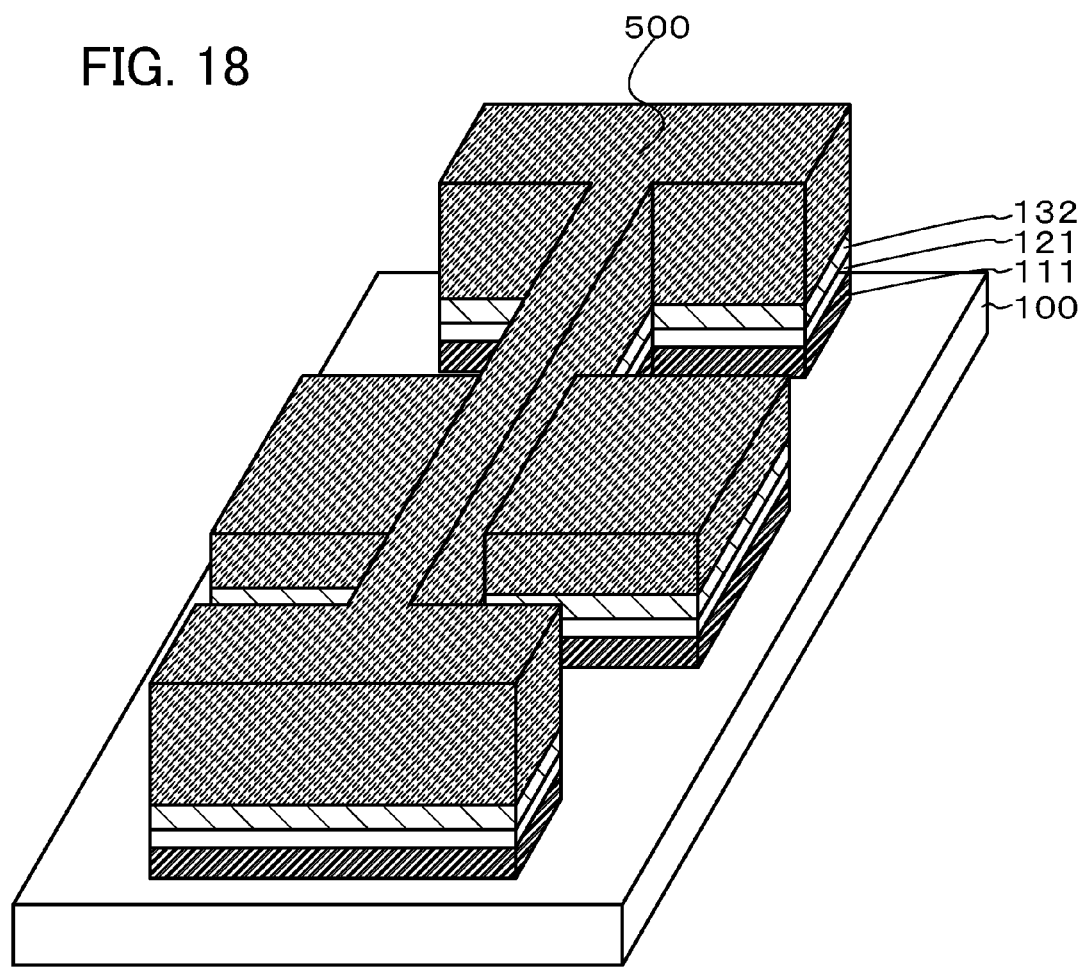
FIG. 18 illustrates an example of a method for manufacturing a semiconductor device.

Next, the stacked-layer structure is etched using the mask 500 to form a conductive layer 111, an insulating layer 121, and a semiconductor layer 132 (FIG. 18).

Here, the area of a second region 8002 and the area of a fourth region 8004 each are smaller than that of the other regions in the mask 500 of FIGS. 17A and 17B.

That is, as for the width in a direction perpendicular to a linear direction along the first region 8001 and a third region 8003 (a direction parallel to the direction in which a carrier flows), the width of the second region 8002 is smaller than the width of each of the first region 8001 and the third region 8003.

As for the width in a direction perpendicular to a linear direction along the fifth region 8005 and the third region 8003 (a direction parallel to the direction in which a carrier flows), the width of the fourth region 8004 is smaller than the width of each of the fifth region 8005 and the third region 8003.

Figure 19:
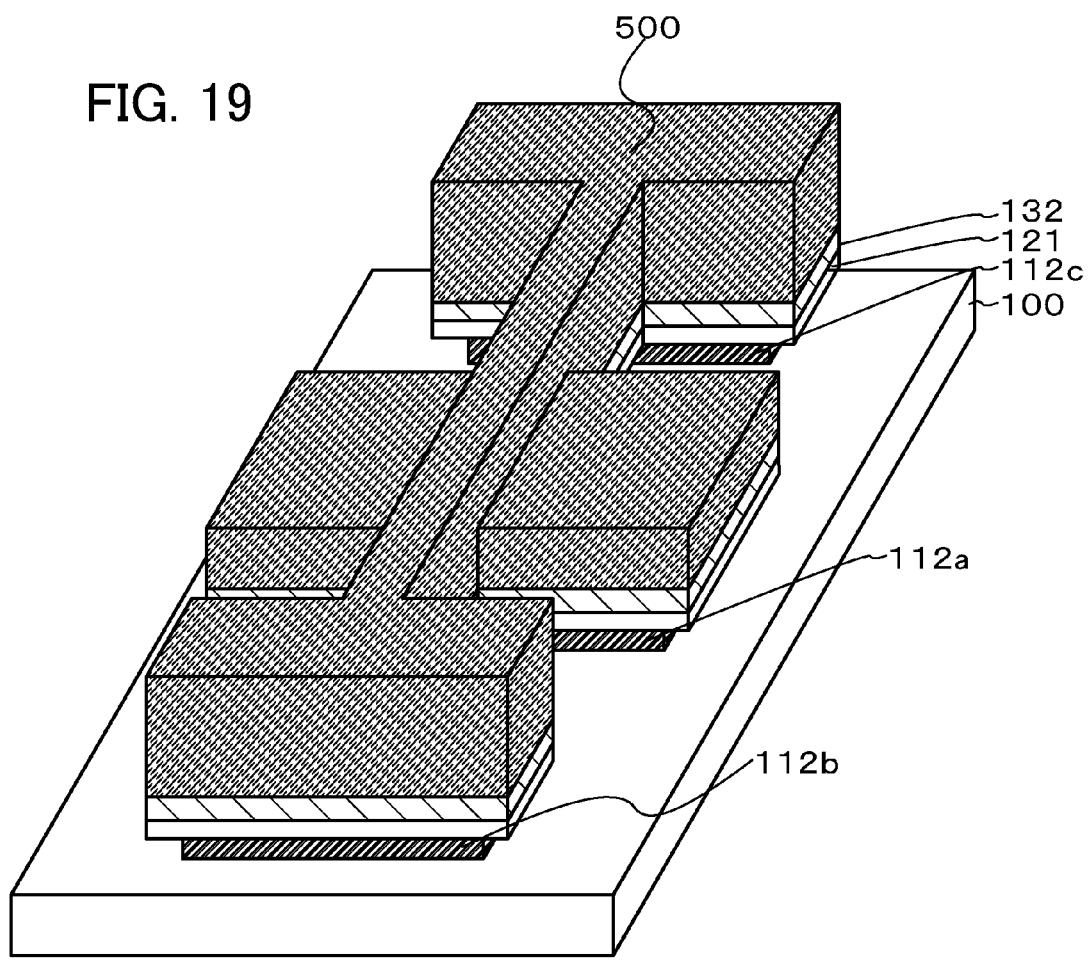
FIG. 19 illustrates an example of a method for manufacturing a semiconductor device.

Then, the stacked-layer structure illustrated in FIG. 18 that has been etched using the mask 500 of FIGS. 17A and 17B is subjected to side-etching (FIG. 19).

The side-etching is performed under the conditions in which the conductive layer in the second region and the fourth region is removed.

The conductive layers under the first, the third, and the fifth regions are left even though slightly etched because the widths of the second region and the fourth region are small.

Therefore, a column electrode 112b is formed in the first region.

In the second region, the conductive layer is removed and the semiconductor layer becomes an eaves portion.

In the third region, a gate electrode 112a is formed and at least part of the semiconductor layer serves as a channel formation region (in the case where a low-concentration impurity region is formed, a Lov region is also formed).

In the fourth region, the conductive layer is removed and the semiconductor layer becomes as an eaves portion.

A column electrode 112c is formed in the fifth region.

Part of the semiconductor layer is fixed by the column electrodes; thus, the possibility that peeling occurs can be reduced.

Note that because the column electrodes are electrically separated from the gate electrode, influence of the column electrodes on operation of a transistor is extremely small.

Figure 20:
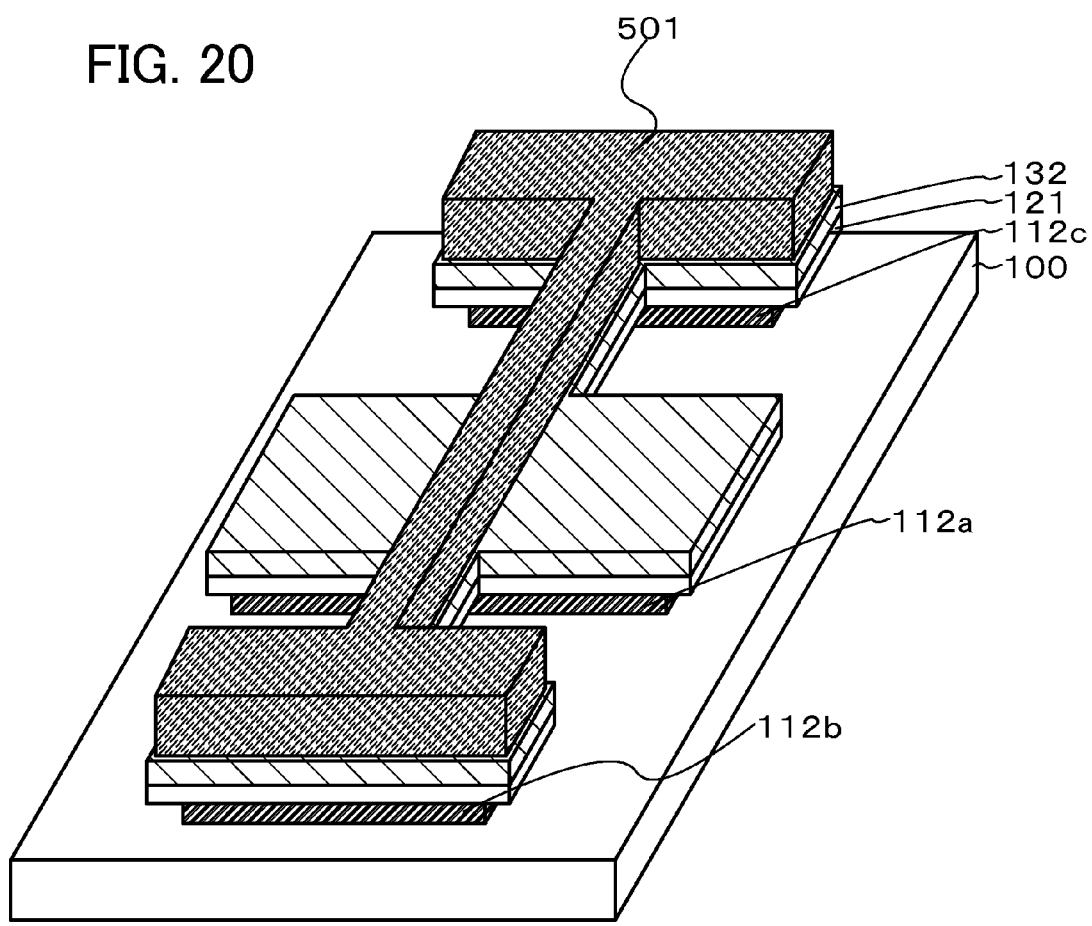
FIG. 20 illustrates an example of a method for manufacturing a semiconductor device.

Next, the thin regions in the mask 500 are removed so that a mask 501 is formed (FIG. 20).

Figure 21:
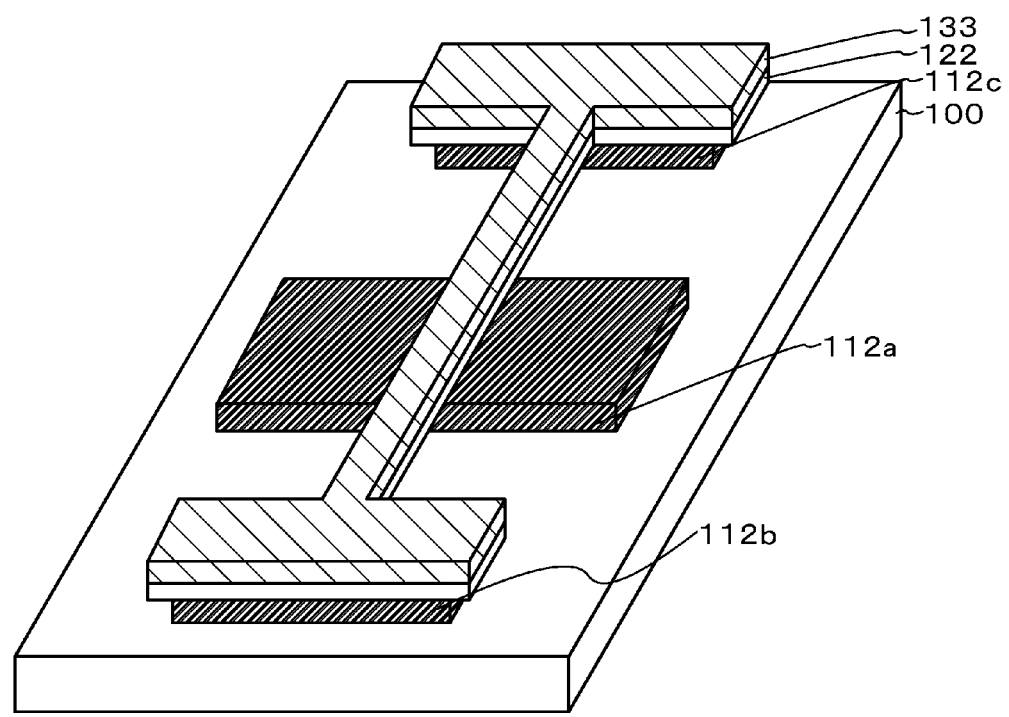
FIG. 21 illustrates an example of a method for manufacturing a semiconductor device.

Then, the semiconductor layer 132 and the insulating layer 121 which are exposed are etched to form a semiconductor layer 133 and an insulating layer 122 (FIG. 21).

Note that the insulating layer 121 is not necessarily removed.

Figure 22:
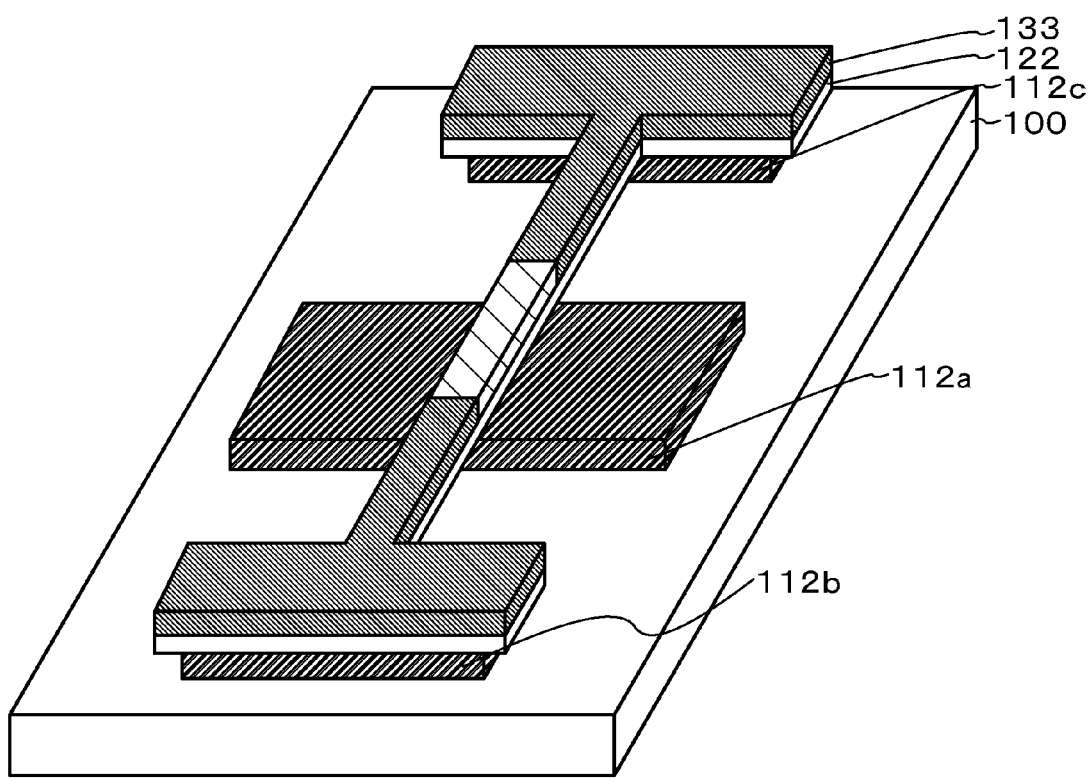
FIG. 22 illustrates an example of a method for manufacturing a semiconductor device.

Next, an impurity is added to the semiconductor layer 133 to determine an impurity region and a channel formation region (FIG. 22).

Note that an impurity semiconductor layer may be formed instead of adding an impurity.

After that, an interlayer insulating film, a wiring, and the like are formed as appropriate.

As described above, peeling can be prevented by forming the column electrodes.

Note that the column electrodes may be formed by making the widths of part of the second region and part of the fourth region small as long as the column electrodes are electrically separated from the gate electrode.

Figure 38A:
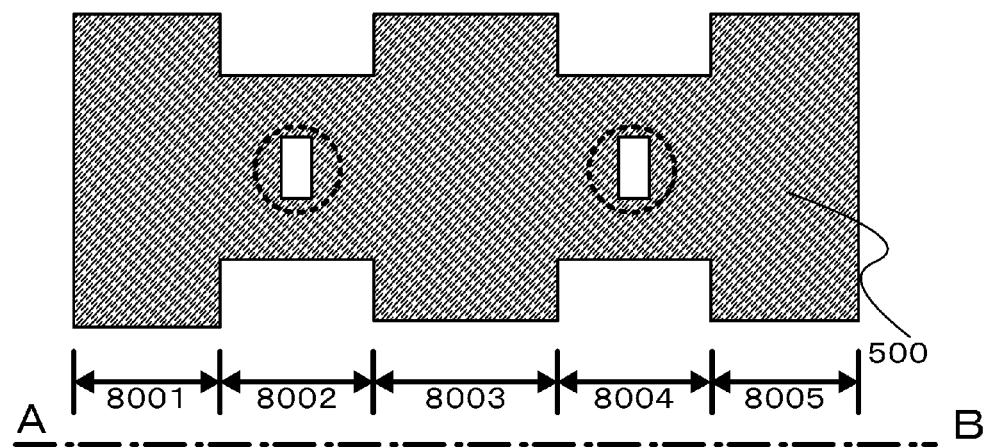
FIGS. 38A and 38B each illustrate an example of a top view of a mask.

For example, in the top shape of the mask 500 illustrated in FIG. 38A, opening portions are formed in the second region 8002 and in the fourth region 8004, so that the widths of regions adjoining the opening portion are made small. Then, the conductive layer in the regions adjoining the opening portions is side-etched to be removed; thus, the column electrodes electrically separated from the gate electrode can be formed.

Figure 38B:
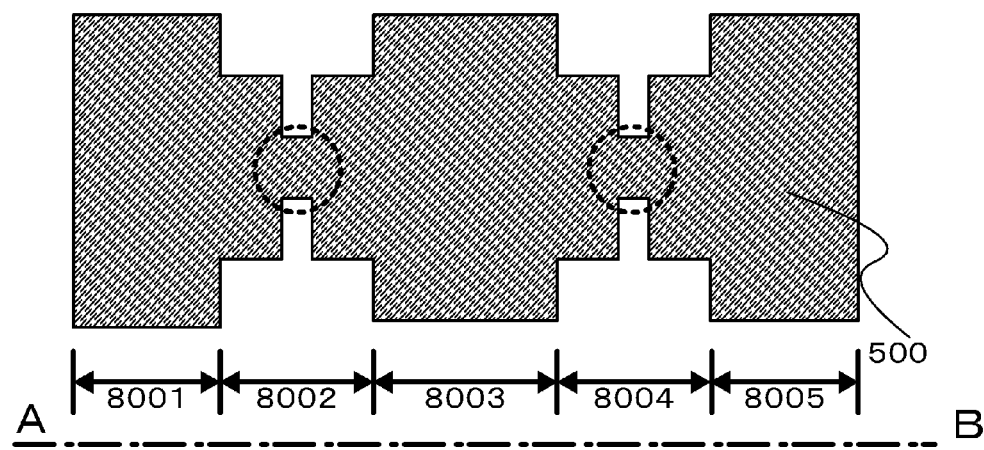

Alternatively, in the top shape of the mask 500 illustrated in FIG. 38B, the widths of part of the second region 8002 and part of the fourth region 8004 are made small, and the conductive layer in the regions having a reduced width is selectively side-etched to be removed; thus, the column electrodes electrically separated from the gate electrode can be formed.

Note that when the structure of FIG. 38A or FIG. 38B is employed, the area of the column electrodes can be increased compared with that of FIG. 17B; accordingly, an effect of preventing peeling can be increased more than that of FIG. 17B.

Further, portions with a thin width and portions with a thick width are provided alternately so that a plurality of column electrodes may be formed.

In the case where a plurality of column electrodes is formed, an effect of preventing peeling can be increased, because the total area of the column electrodes is increased in proportion to the number of the column electrodes.

This embodiment can be combined with any of the other embodiments.

Embodiment 6

In this embodiment, the mask structures in the first region 8001 and the fifth region 8005 illustrated in FIGS. 17A and 17B are improved.

Figure 23A:
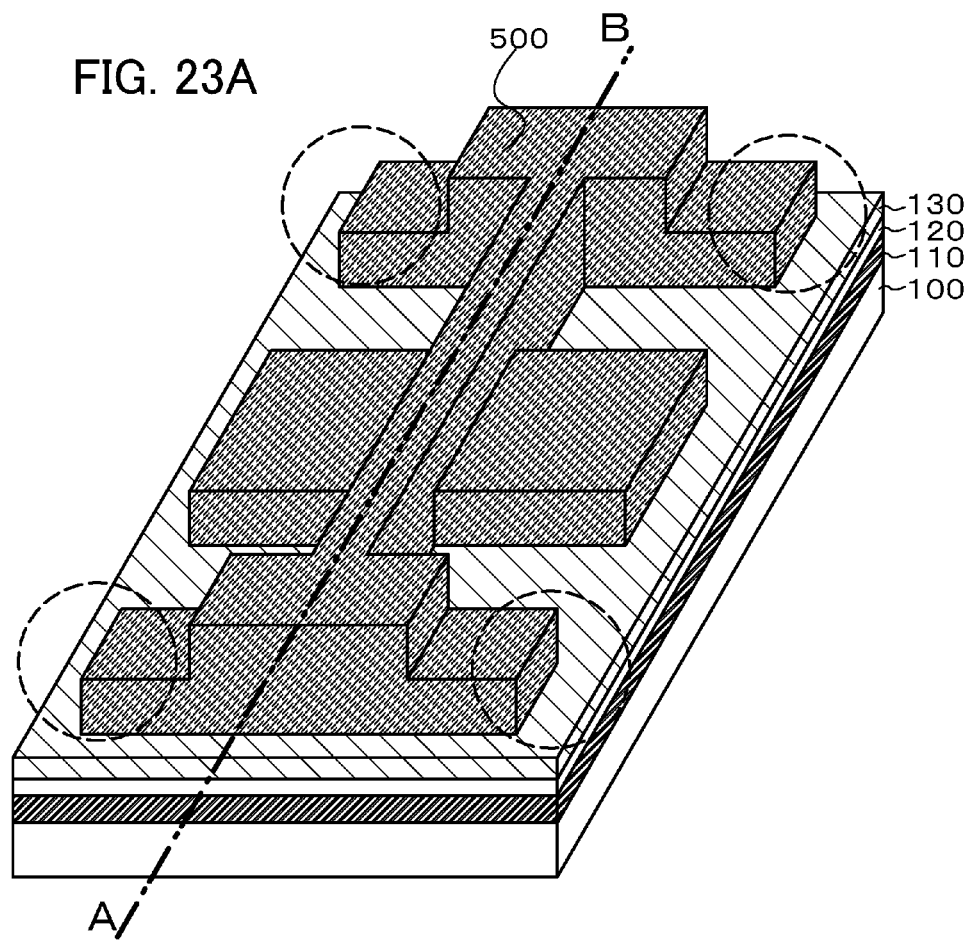
FIGS. 23A and 23B illustrate an example of a method for manufacturing a semiconductor device.
Figure 23B:
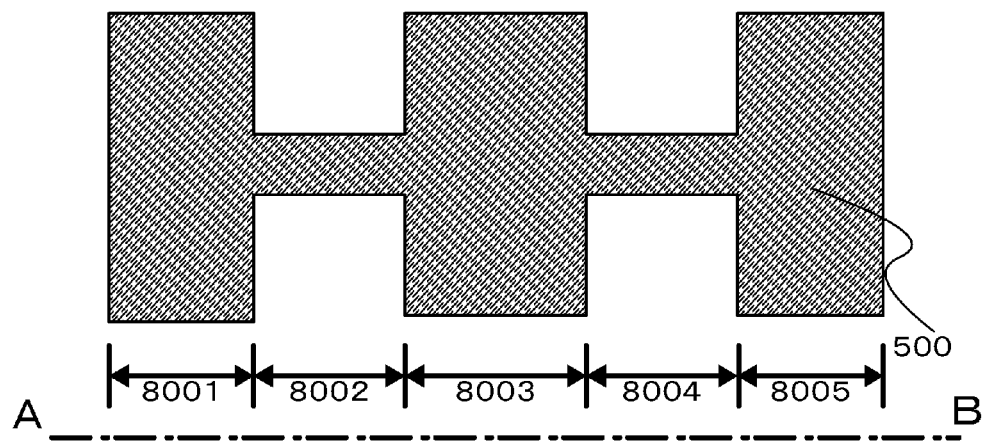

FIGS. 23A and 23B are views corresponding to FIGS. 17A and 17B.

FIG. 23A differs from FIG. 17A in that thin film regions shown by a dashed line are formed in the first region and the fifth region.

Note that although two thin film regions are formed in each of the first region and the fifth region in FIG. 23A, at least one thin film region may be formed in each of the first region and the fifth region.

Three or more thin film regions may be formed.

Alternatively, at least one thin film region may be formed in either the first region or the fifth region.

Figure 24:
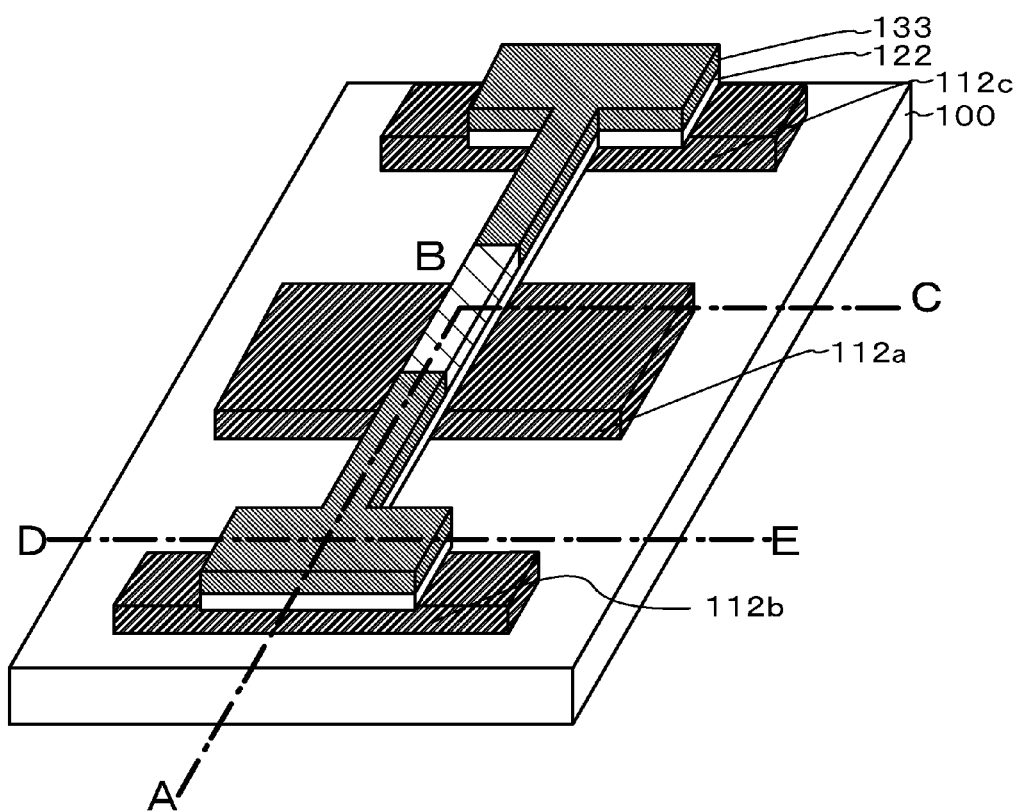
FIG. 24 illustrates an example of a method for manufacturing a semiconductor device.

Then, the stacked-layer structure is etched and then the conductive layer is subjected to side-etching in a manner similar to that in Embodiment 5; accordingly, a structure in which part of the column electrode sticks out (a projecting shape) can be formed in the first region and the fifth region (FIG. 24).

That is, in the first region, a step shape including a column electrode 112b, a semiconductor layer 133, and an insulating layer 122 is formed.

Further, in the fifth region, a step shape including a column electrode 112c, the semiconductor layer 133, and the insulating layer 122 is formed.

In the third region (a region which serves as a channel formation region), a step shape including a gate electrode, a semiconductor layer, an insulating layer is formed as in the other embodiments.

Then, a wiring is formed through the step portion; whereby, disconnection of the wiring can be prevented.

Figure 25A:
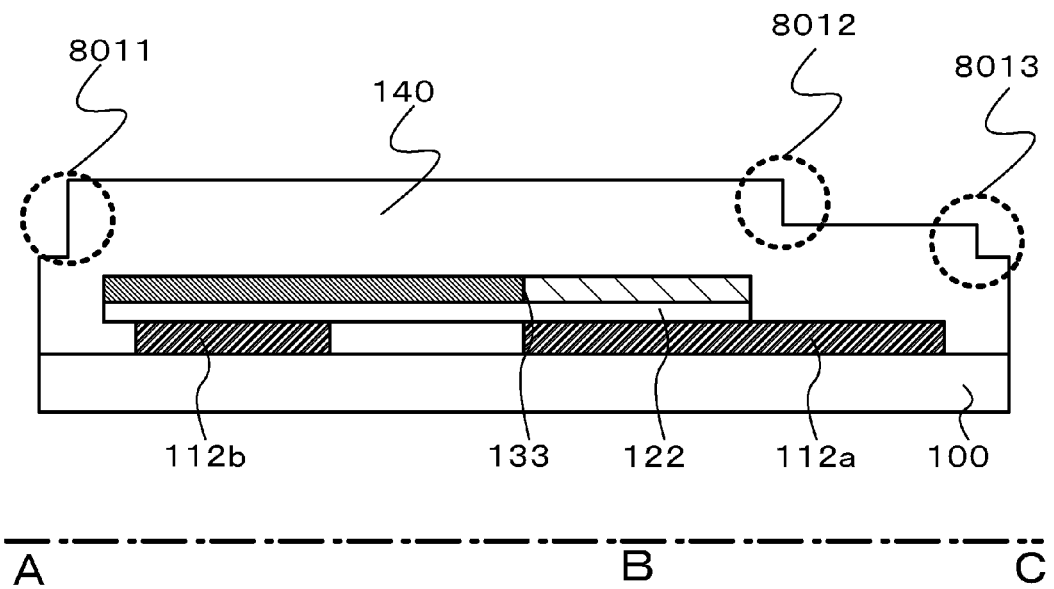
FIGS. 25A and 25B illustrate an example of a method for manufacturing a semiconductor device.
Figure 25B:
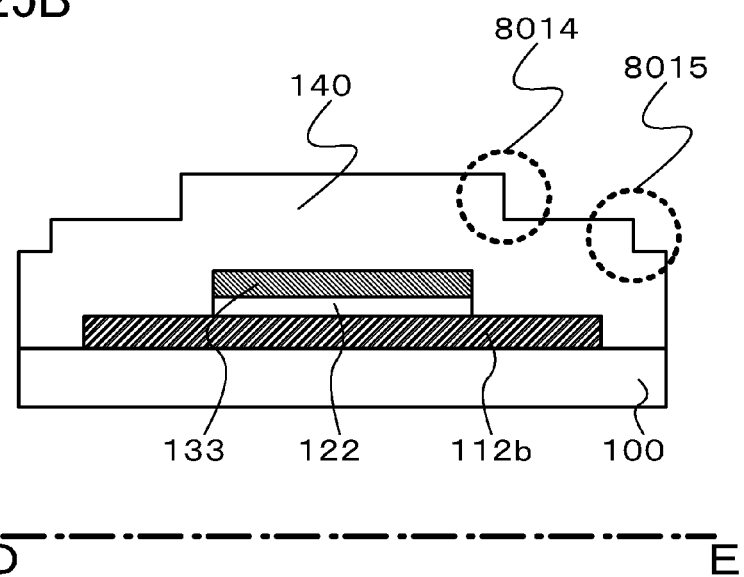

Specifically, the case of forming an interlayer insulating film 140 in FIG. 24 is considered (FIGS. 25A and 25B).

The interlayer insulating film 140 is formed to have a shape reflecting the step under the interlayer insulating film 140.

Note that an influence of the step is significant in the case where the interlayer insulating film is formed of an inorganic material.

On the other hand, in the case where the interlayer insulating film is formed of an organic material (a so-called planarization film), the influence of the step is relieved but the step cannot be flattened completely.

Accordingly, it is considered that any interlayer insulating film has an influence of the step.

In FIGS. 25A and 25B, a difference in height in a portion with a dashed line 8011 is large compared with that in portions with dashed lines 8012 to 8015.

Therefore, the wiring is preferably formed through the portions having a step shape with the dashed lines 8012 and 8013 (FIG. 25A, FIGS. 26A and 26B) or the portions having a step shape with the dashed lines 8014 and 8015 (FIG. 25B, FIGS. 27A and 27B) without through the portion with the dashed line 8011.

Note that FIG. 25A is a cross-sectional view taken along A-B-C in FIG. 24.

FIG. 25B is a cross-sectional view taken along D-E in FIG. 24.

Figure 26A:
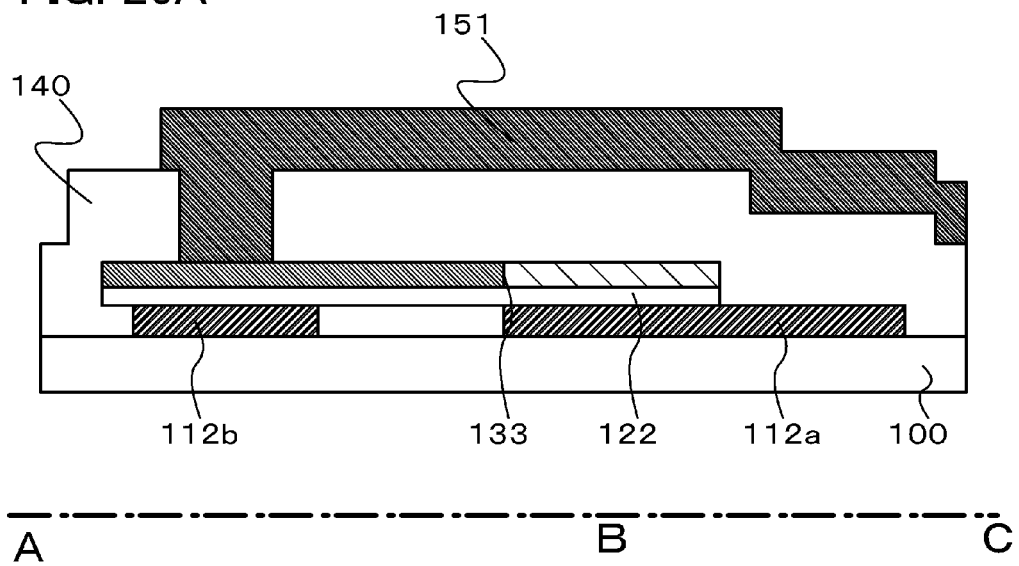
FIGS. 26A and 26B illustrate an example of a method for manufacturing a semiconductor device.

FIG. 26A is a cross-sectional view taken along A-B-C in FIG. 24.

Figure 26B:
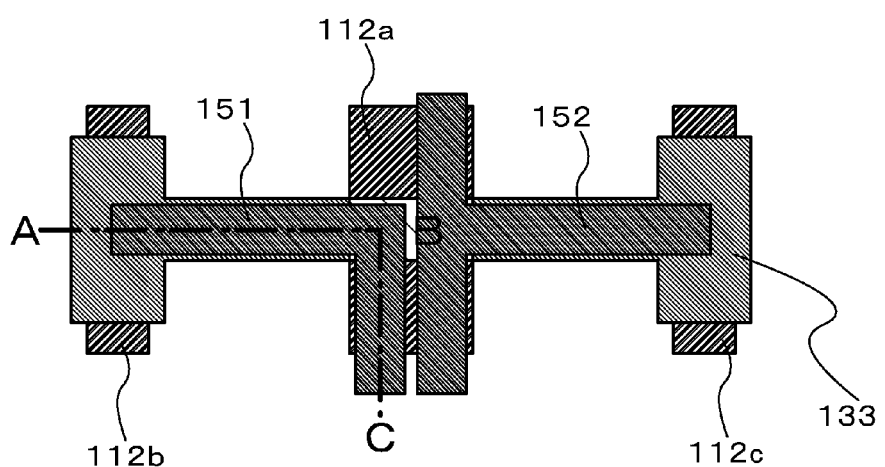

FIG. 26B is a top view of FIG. 26A and A-B-C in FIGS. 26A and 26B corresponds to A-B-C in FIG. 24.

Figure 27A:
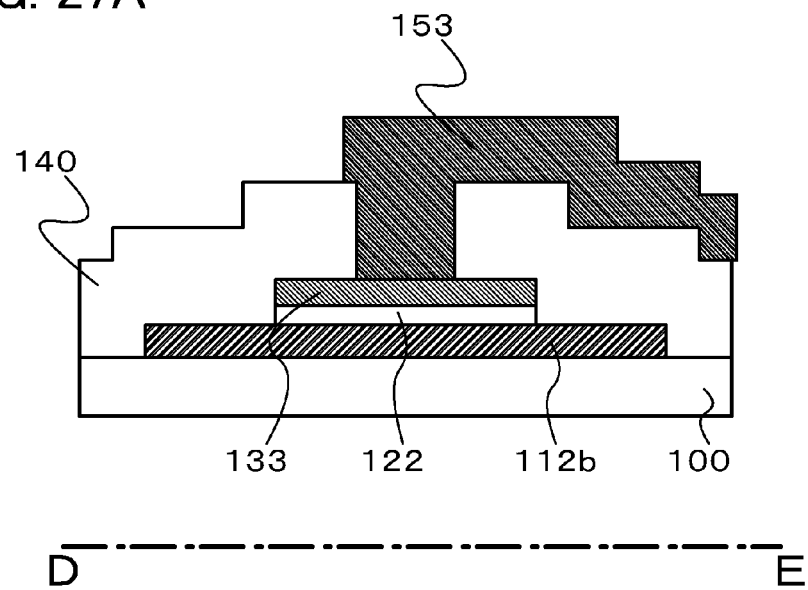
FIGS. 27A and 27B illustrate an example of a method for manufacturing a semiconductor device.

FIG. 27A is a cross-sectional view taken along D-E in FIG. 24.

Figure 27B:
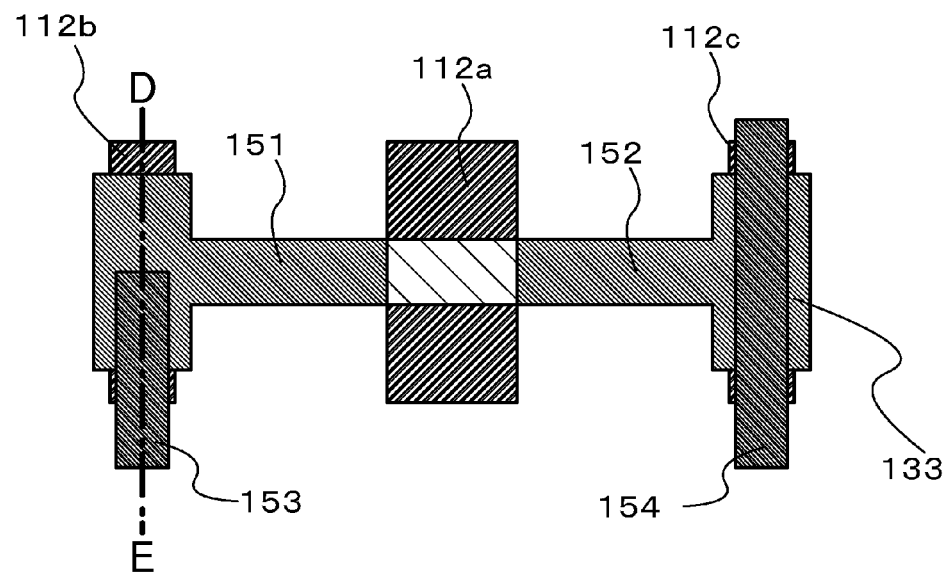

FIG. 27B is a top view of FIGS. 27A and D-E in FIGS. 27A and 27B corresponds to D-E in FIG. 24.

Figure 28A:
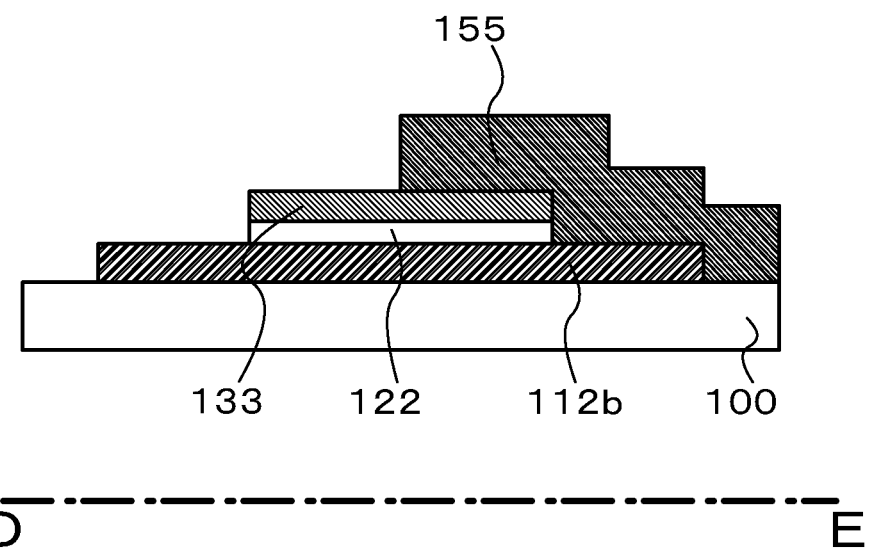
FIGS. 28A and 28B illustrate an example of a method for manufacturing a semiconductor device.

FIG. 28A is a cross-sectional view taken along D-E in FIG. 24.

Figure 28B:
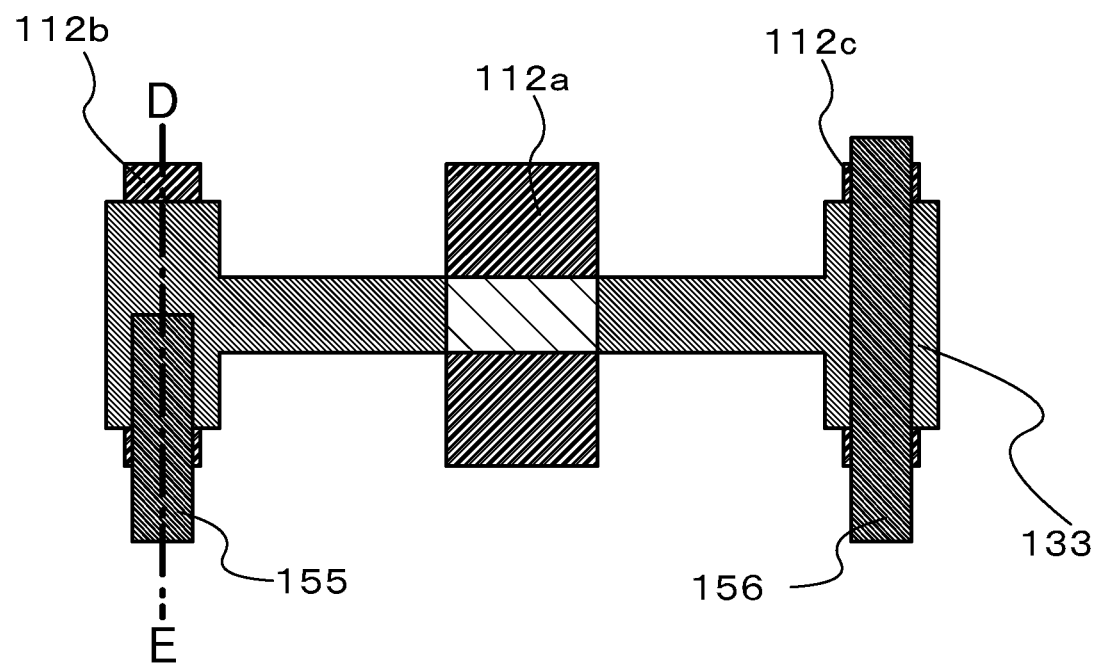

FIG. 28B is a top view of FIGS. 28A and D-E in FIGS. 28A and 28B corresponds to D-E in FIG. 24.

For example, in FIGS. 26A and 26B, a wiring 151 is formed over the interlayer insulating film 140.

The wiring 151 is electrically connected to the semiconductor layer 133 in the first region and extends through the second and the third regions to be electrically connected to another transistor and the like.

Further, a wiring 152 is electrically connected to the semiconductor layer 133 in the fifth region and extends through the fourth and the third regions to be electrically connected to another transistor and the like.

Note that the wiring may extend to only one direction as the wiring 151 or may extend to both directions as the wiring 152.

A step shape of the gate electrode can be used in the case where a column electrode is not provided or in the case where the column electrode does not stick out.

In FIGS. 27A and 27B, a wiring 153 and a wiring 154 are provided over the interlayer insulating film and electrically connected to the semiconductor layer 133 through a contact hole.

The wiring 153 and the wiring 154 each extend through a portion which overlaps a portion in which the column electrode sticks out (a projecting portion) to be electrically connected to another transistor and the like.

In FIGS. 28A and 28B, a wiring 155 and a wiring 156 are provided each of which is electrically connected to the semiconductor layer 133 without through an interlayer insulating film.

The wiring 155 and the wiring 156 each extend through a portion which overlaps a portion in which the column electrode sticks out (a projecting portion) to be electrically connected to another transistor and the like.

As described above, disconnection of a wiring can be prevented by forming a step shape and providing a wiring using the step shape.

Further, when a gate electrode layer has a stacked-layer structure and a portion in which the gate electrode sticks out is processed by etching to have a step shape, the effect of preventing disconnection can be promoted.

This embodiment can be combined with any of the other embodiments.

Embodiment 7

In this embodiment, arrangement of an impurity region and an impurity semiconductor layer is described.

Figure 29A:
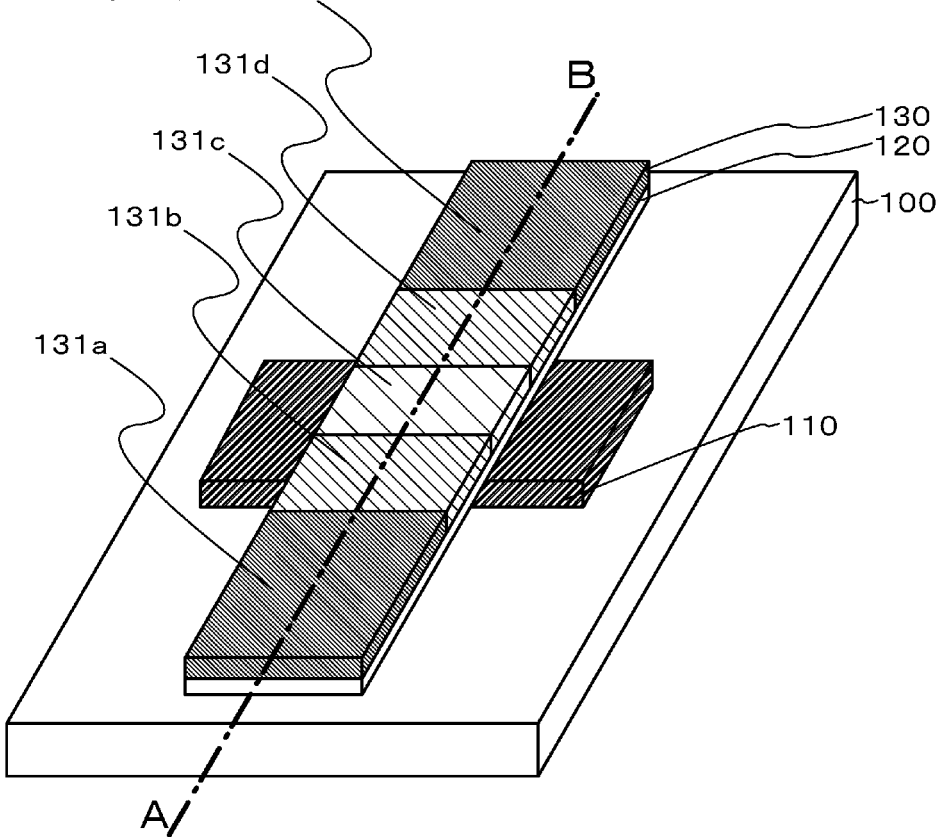
FIGS. 29A and 29B illustrate an example of a method for manufacturing a semiconductor device.
Figure 29B:
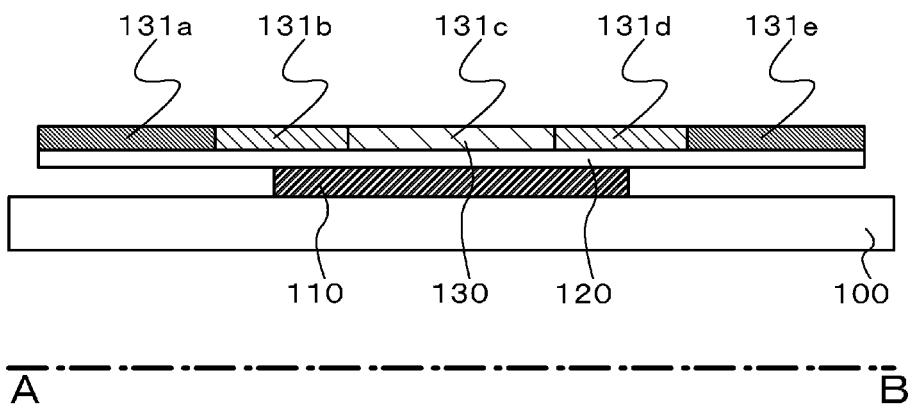

In FIGS. 29A and 29B, a conductive layer 110 (a gate electrode), a gate insulating layer 120, a semiconductor layer 130 are formed in this order over a substrate 100.

A high-concentration impurity region 131a, a low-concentration impurity region 131b, a channel formation region 131c, a low-concentration impurity region 131d, and a high-concentration impurity region 131e are formed in the semiconductor layer 130.

Note that FIG. 29B is a cross-sectional view taken along A-B in FIG. 29A.

Each of the low-concentration impurity regions 131b and 131d overlaps part of the gate electrode.

In other words, each of the low-concentration impurity regions 131b and 131d is divided into two regions; thereby including a Lov region and a Loff region.

When both a Lov region and a Loff region are formed, the disadvantage of the Lov region can be removed by the Loff region.

The low-concentration impurity regions are provided for relaxing an electric-field concentration.

On the other hand, when a step shape in an edge portion of the gate electrode is reflected to the semiconductor layer, there is a problem in that an electric-field concentration occurs in the reflected step portion of the semiconductor layer.

Thus, the advantage of a structure in which a space is provided under part of a semiconductor layer is remarkable in the case where a low-concentration impurity region crosses an end portion (an edge) of the gate electrode, as in the structure in which both a Lov region and a Loff region are formed.

Figure 30A:
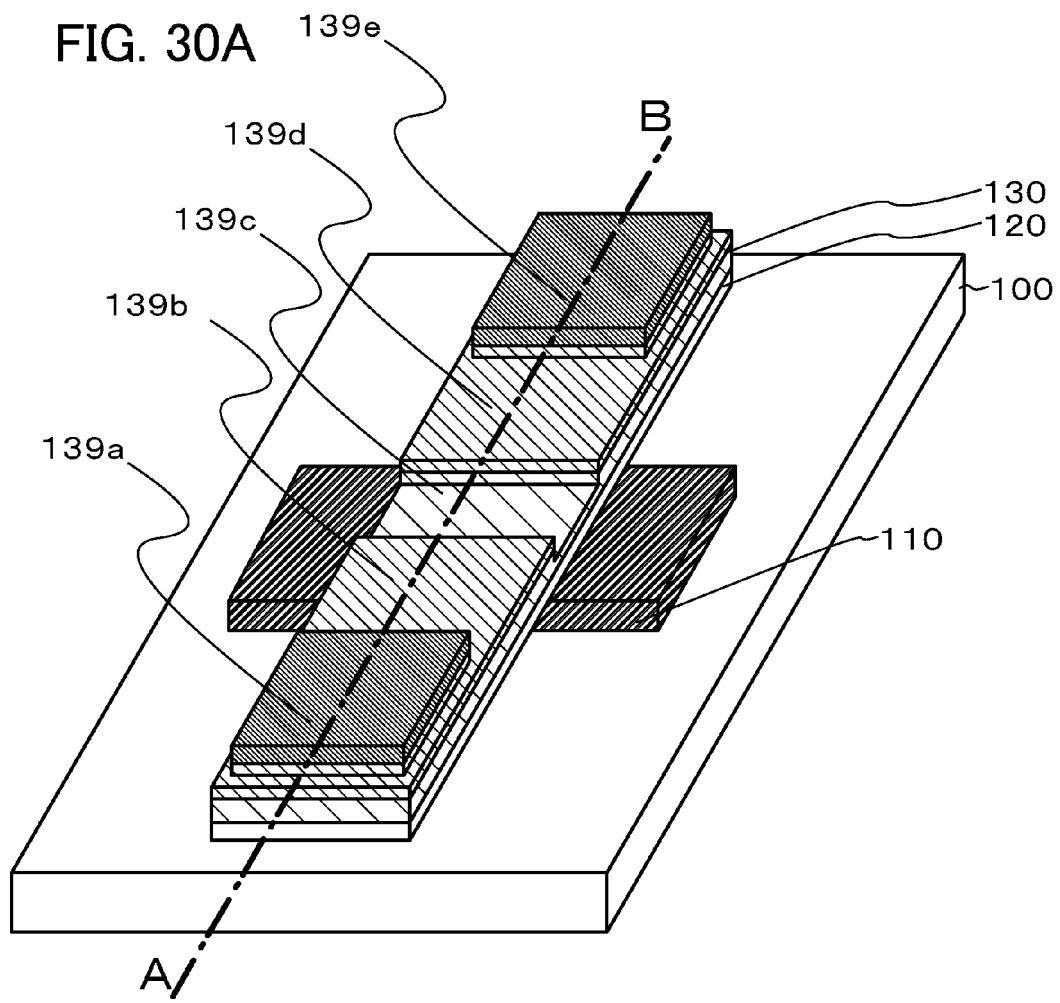
FIGS. 30A and 30B illustrate an example of a method for manufacturing a semiconductor device.
Figure 30B:
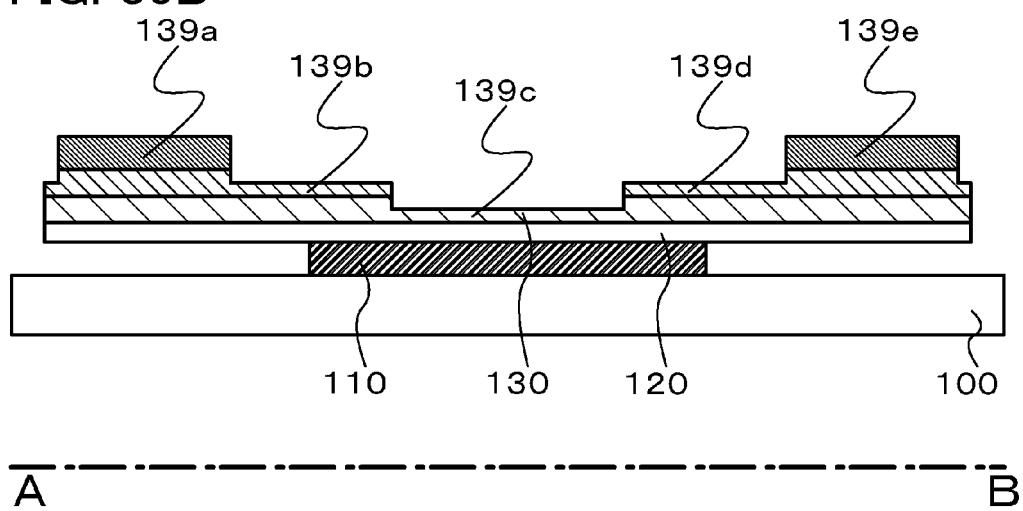

In FIGS. 30A and 30B, impurity semiconductor layers are formed instead of the impurity regions.

In the semiconductor layer 130, a channel formation region 139c is provided.

Further, a low-concentration impurity semiconductor layer 139b and a low-concentration impurity semiconductor layer 139d are provided over the semiconductor layer 130.

Furthermore, high-concentration impurity semiconductor layers 139a and 139e are provided respectively over the low-concentration impurity semiconductor layers 139b and 139d.

Note that FIG. 30B is a cross-sectional view taken along A-B in FIG. 30A.

In FIGS. 30A and 30B, a carrier flowing in the channel formation region 139c gets into a closer low-concentration impurity region formed in a position which overlaps the gate electrode.

Then, the carrier passes through the low-concentration impurity region which does not overlap the gate electrode, and reaches the high-concentration impurity region.

Therefore, in FIGS. 30A and 30B, both a Lov region and a Loff region are formed as in FIGS. 29A and 29B.

Note that although a column electrode is not provided in FIGS. 29A, 29B, 30A, and 30B, a column electrode may be provided because the effect of this embodiment is not lost.

This embodiment can be combined with any of the other embodiments.

Embodiment 8

In this embodiment, an example of a method for manufacturing a CMOS circuit is described.

Figure 31A:
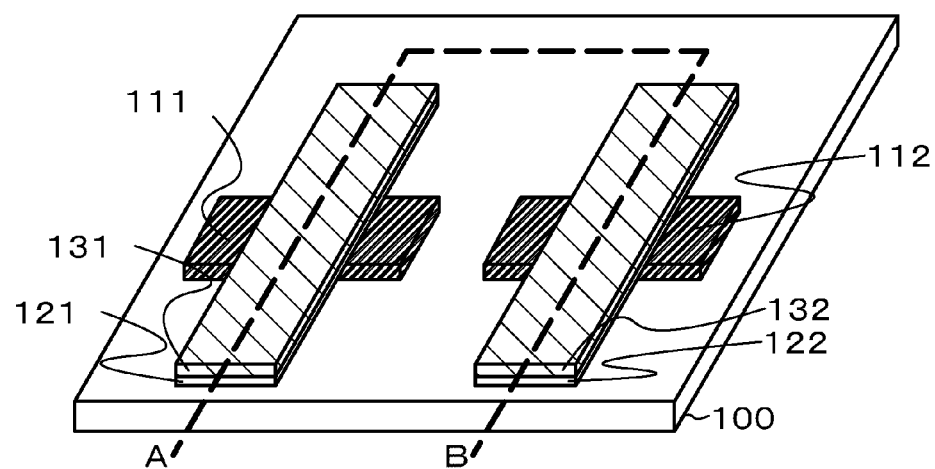
FIGS. 31A and 31B illustrate an example of a method for manufacturing a semiconductor device.
Figure 31B:
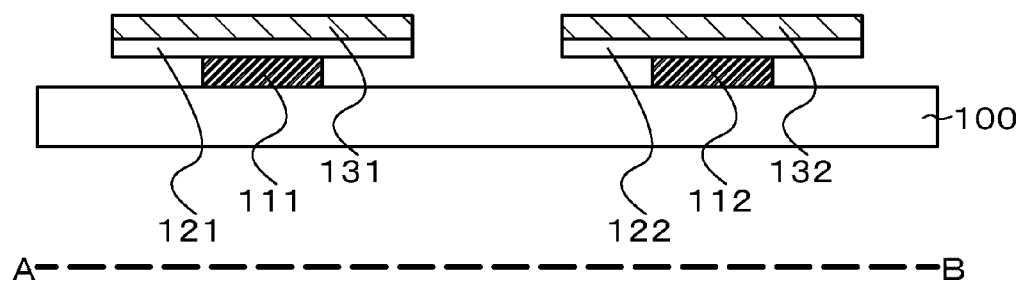

In FIGS. 31A and 31B, a conductive layer 111 (a gate electrode) and a conductive layer 112 (a gate electrode) are provided over a substrate 100 having an insulating surface, a stack in which a gate insulating layer 121 and a semiconductor layer 131 are stacked in this order is provided over the conductive layer 111, and a stack in which a gate insulating layer 122 and a semiconductor layer 132 are stacked in this order is provided over the conductive layer 112.

Note that FIG. 31B is a cross-sectional view taken along A-B in FIG. 31A.

Figure 32:
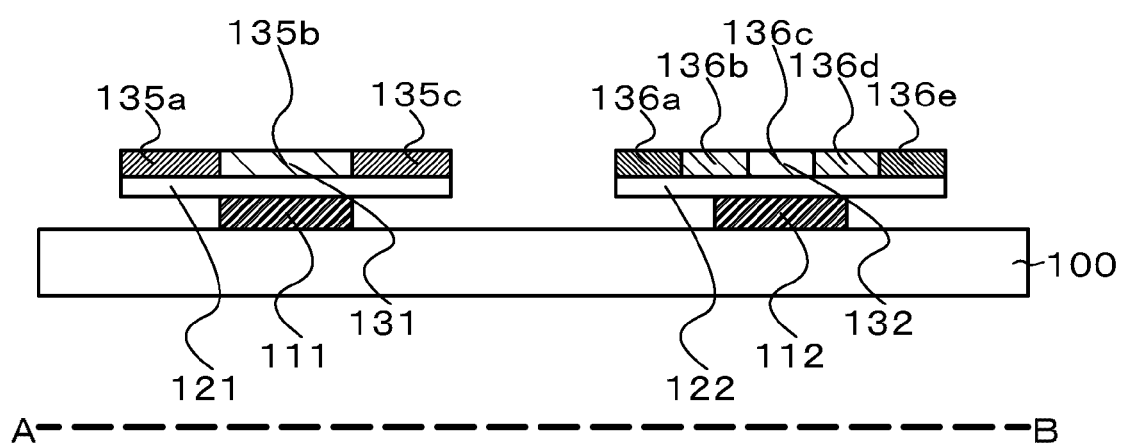
FIG. 32 illustrates an example of a method for manufacturing a semiconductor device.

In FIG. 32, a first impurity and a second impurity which imparts a conductivity opposite to that of the first impurity are added, respectively, to the semiconductor layer 131 and the semiconductor layer 132 illustrated in FIGS. 31A and 31B.

The impurities may be added using a mask or the like.

In FIG. 32, a high-concentration impurity region 135a, a channel formation region 135b, and a high-concentration impurity region 135c are formed in the semiconductor layer 131.

In FIG. 32, a high-concentration impurity region 136a, a low-concentration impurity region 136b, a channel formation region 136c, a low-concentration impurity region 136d, and a high-concentration impurity region 136e are formed in the semiconductor layer 132.

Note that a transistor having the semiconductor layer 132 in FIG. 32 corresponds to the transistor in FIGS. 29A and 29B.

As described above, by adding a necessary impurity as appropriate using a mask or the like, a CMOS circuit can be formed.

Note that although the low-concentration impurity regions are formed only in the semiconductor layer 132 in this embodiment, a low-concentration impurity region may be formed in the semiconductor layer 131.

This embodiment can be combined with any of the other embodiments.

Embodiment 9

In this embodiment, an example of a method for manufacturing a CMOS circuit is described.

First, a conductive layer 111 (a gate electrode) and a conductive layer 112 (a gate electrode) are provided over a substrate 100 having an insulating surface, a stack in which a gate insulating layer 121 and a semiconductor layer 131 are stacked in this order is provided over the conductive layer 111, and a stack in which a gate insulating layer 122 and a semiconductor layer 132 are stacked in this order is provided over the conductive layer 112 (FIGS. 31A and 31B).

Note that FIG. 31B is a cross-sectional view taken along A-B in FIG. 31A.

Figure 33A:
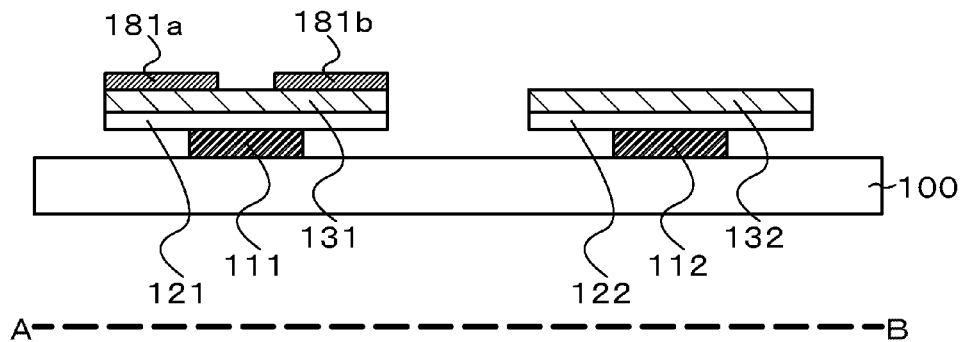
FIGS. 33A to 33C illustrate an example of a method for manufacturing a semiconductor device.

Next, high-concentration impurity semiconductor layers 181a and 181b which include a first impurity element are formed over the semiconductor layer 131 (FIG. 33A).

Figure 33B:
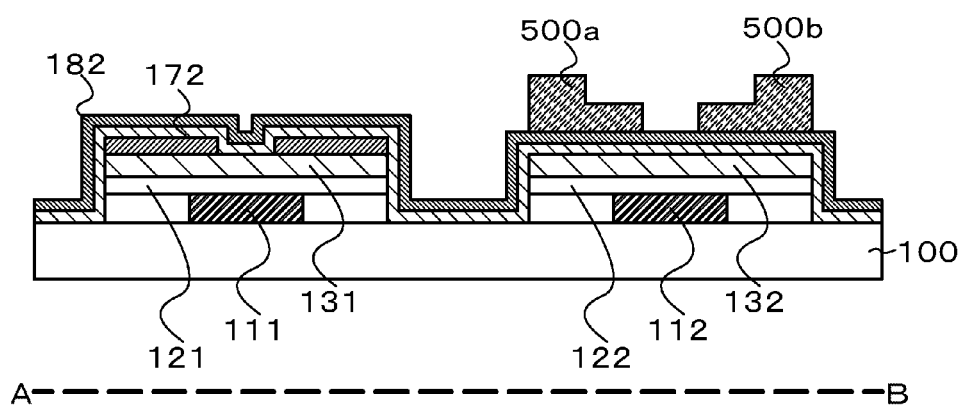

Next, over the semiconductor layer 131, the high-concentration impurity semiconductor layers 181a and 181b, and the semiconductor layer 132, a low-concentration impurity semiconductor layer 172 including a second impurity element and a high-concentration impurity semiconductor layer 182 including the second impurity element are formed in this order. A mask 500a and a mask 500b each are formed over the high-concentration impurity semiconductor layer 182 in a position which overlaps the semiconductor layer 132 (FIG. 33B).

Note that the first impurity element imparts a conductivity opposite to that of the second impurity element.

The mask 500a and the mask 500b each have a thick film region and a thin film region.

Figure 33C:
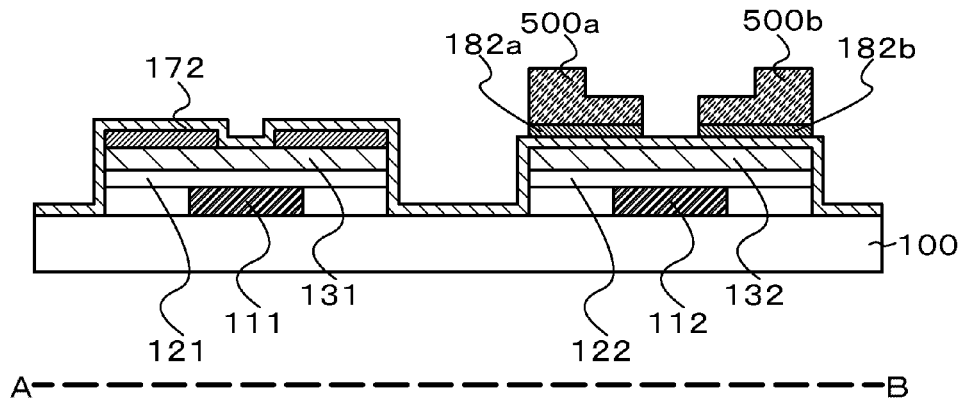

Next, the high-concentration impurity semiconductor layer 182 is etched using the masks 500a and 500b to form high-concentration impurity semiconductor layers 182a and 182b (FIG. 33C).

Figure 34A:
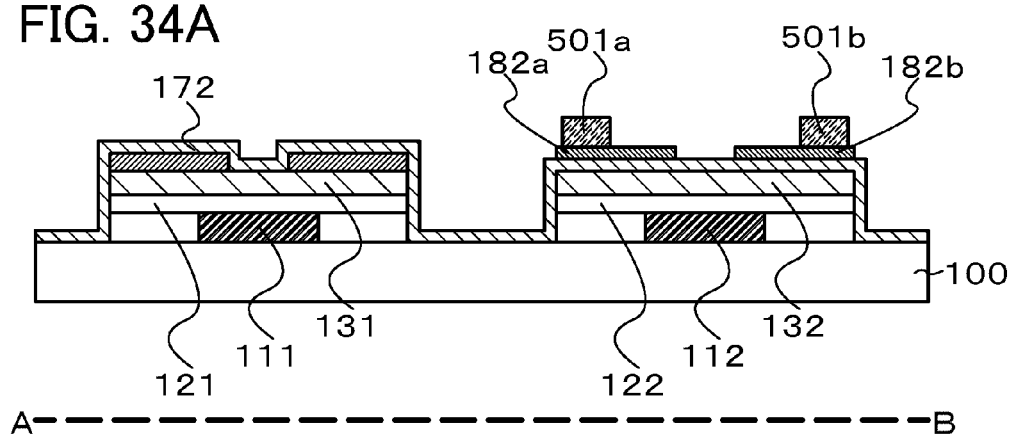
FIGS. 34A to 34C illustrate an example of a method for manufacturing a semiconductor device.

The thin film regions in the masks 500a and 500b are removed so that a mask 501a and a mask 501b are formed (FIG. 34A).

Figure 34B:
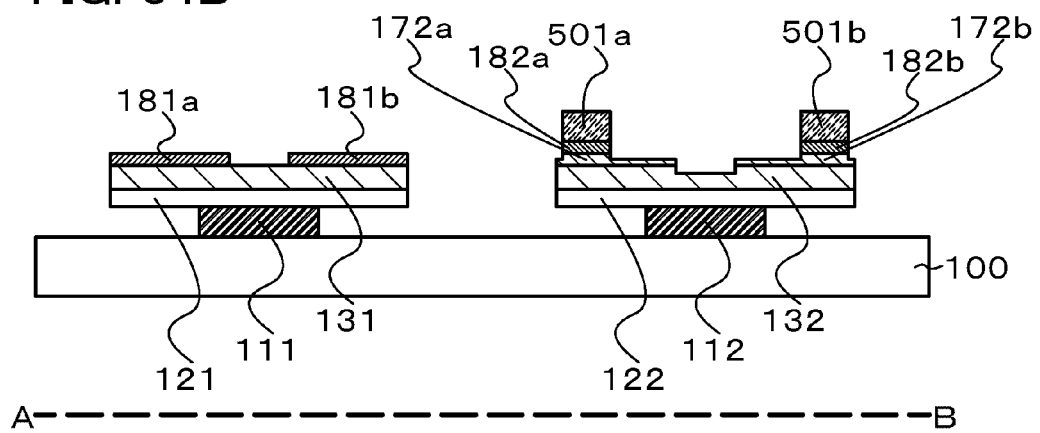

Next, the high-concentration impurity semiconductor layers 182a and 182b are processed by etching using the masks 501a and 501b while the low-concentration impurity semiconductor layers 172a and 172b are formed (FIG. 34B).

Figure 34C:
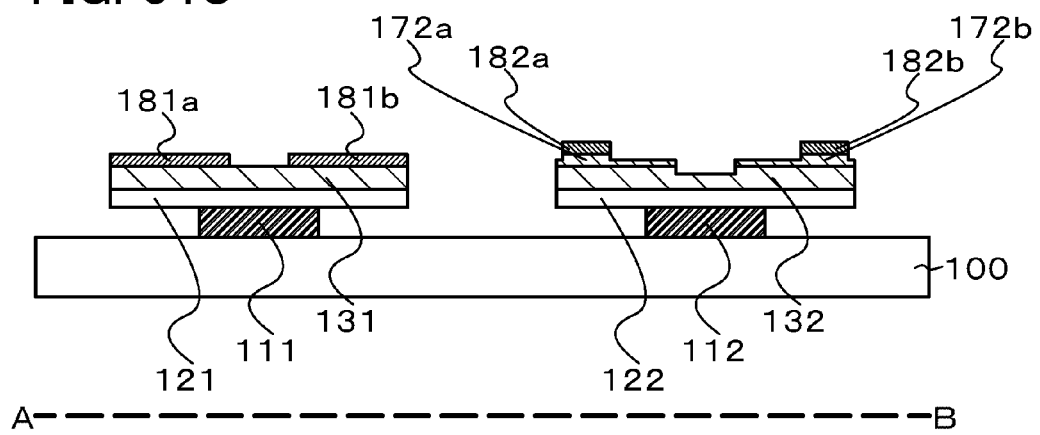

Then, the masks 501a and 501b are removed (FIG. 34C).

Note that a transistor having the semiconductor layer 132 in FIG. 34C corresponds to a transistor in FIGS. 30A and 30B.

As described above, by using a mask having a thick film region and a thin film region, a CMOS circuit having a transistor in which both a Lov region and a Loff region are formed can be formed without significantly increasing the number of steps.

This embodiment can be combined with any of the other embodiments.

Embodiment 10

In this embodiment, an example of a method for forming a stacked-layer structure in which a conductive layer, an insulating layer, and a semiconductor layer are stacked in this order is described.

In order to simply form a stacked-layer structure in which a conductive layer, an insulating layer, and the semiconductor layer are stacked in this order, the conductive layer, an insulating layer, and the semiconductor layer may be deposited in this order by a deposition method such as a CVD method or a sputtering method.

Another method is described below.

First, a substrate 100 with a surface over which a conductive layer 110 is formed and a semiconductor substrate 129 with a surface over which an insulating layer 120 is formed and an embrittlement region 1400 formed inside are prepared.

Figure 35A:
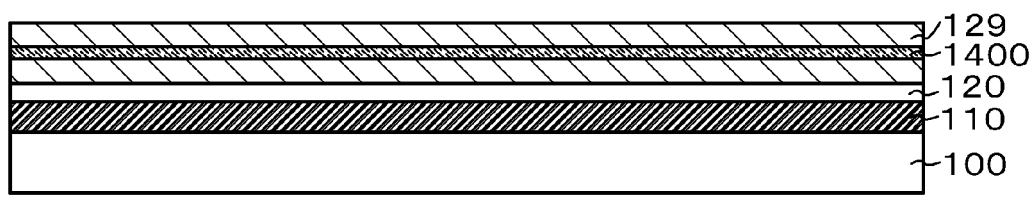
FIGS. 35A and 35B illustrate an example of a method for manufacturing a stacked-layer structure.

Then, the conductive layer 110 and the insulating layer 120 are attached and bonded to each other (FIG. 35A, an attachment step).

Note that in order that the conductive layer 110 and the insulating layer 120 are bonded to each other, the smoothness of each surface is important.

As for the smoothness, the average surface roughness (Ra) is preferably less than or equal to 0.50 nm in the case of measuring with an atomic force microscope (AFM) (more preferably, the average surface roughness is less than or equal to 0.35 nm (still more preferably, the average surface roughness is less than or equal to 0.20 nm)).

The embrittlement region is formed at a predetermined depth by adding a predetermined ion (hydrogen, helium, or the like) from the surface side of the semiconductor substrate.

Figure 35B:
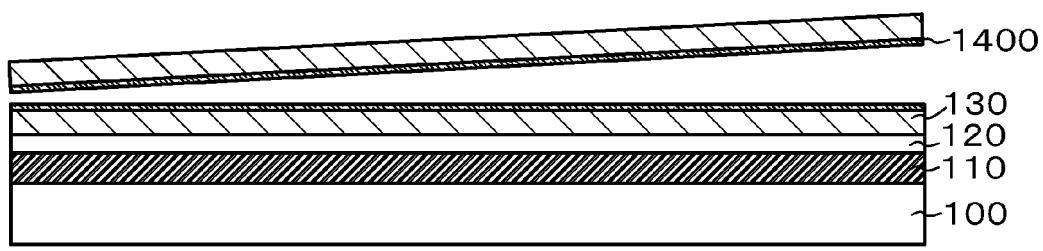

Then, a heat treatment is performed in a state where the conductive layer 110 and the insulating layer 120 are attached and bonded to each other, so that a crack is generated in the embrittlement region 1400; therefore, part of the semiconductor substrate is separated and a semiconductor layer 130 can be left on the substrate 100 side (FIG. 35B, a separation step).

In particular, when a single crystal semiconductor is used for the semiconductor substrate, a high-performance transistor can be manufactured.

Accordingly, this method is superior to deposition methods.

Note that the embrittlement region 1400 is left on the semiconductor substrate side because a crack is generated in the embrittlement region 1400.

Therefore, the surface of the semiconductor layer 130 is preferably etched to some extent to remove the embrittlement region.

In addition, the semiconductor layer 130 is preferably irradiated with laser light because the light irradiation allows repairing crystal destruction which occurs by adding the predetermined ion.

Note that when attaching is performed after a pattern of a gate electrode is formed, the following problem is generated, and thus, the stacked-layer structure in which the conductive layer, the insulating layer, and the semiconductor layer are stacked in this order is preferably formed.

Figure 36A:
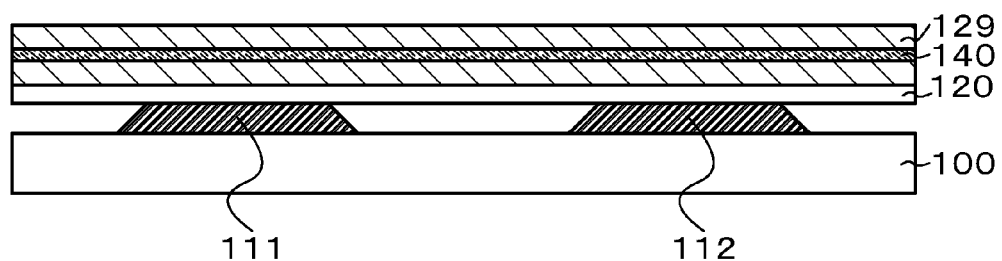
FIGS. 36A and 36B illustrate an example of a method for manufacturing a stacked-layer structure.

In FIG. 36A, the substrate 100 with a surface over which conductive layers 111 and 112 (gate electrodes) are formed and the semiconductor substrate 129 with a surface over which the insulating layer 120 is formed and the embrittlement region 1400 formed inside are prepared, and the conductive layers 111 and 112 are attached and bonded to the insulating layer 120.

In this case, each of the gate electrodes has an extremely small width of from several micrometers to several hundreds micrometers. Accordingly, the area of the bonding portion in FIG. 36A is significantly small compared with that in FIG. 35A.

Since the bonding strength relates to the bonding area, the bonding strength is not enough in FIG. 36A.

Figure 36B:
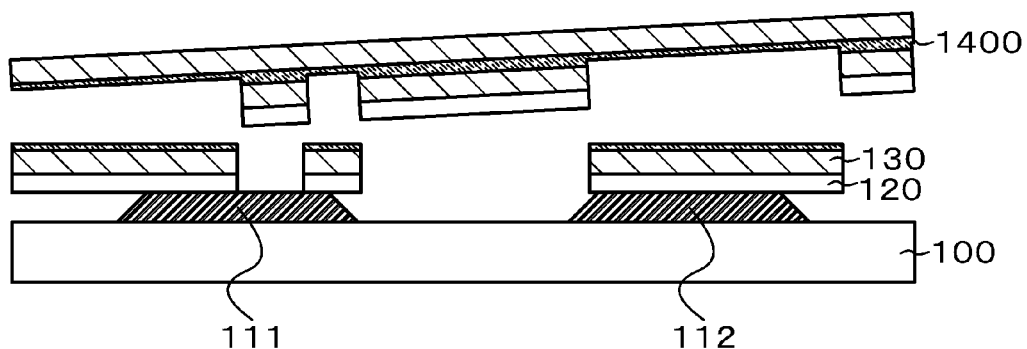

Therefore, when a separation step is performed in FIG. 36A, peeling may be generated as in FIG. 36B because the bonding strength is not enough.

Accordingly, a pattern of a gate electrode is preferably formed after the separation step.

This embodiment can be combined with any of the other embodiments.

Embodiment 11

A multi-tone mask is described.

A multi-tone mask refers to a mask capable of light exposure with three levels of light intensity to provide an exposed region, a half-exposed region, and an unexposed region.

Figures 1, 37A:
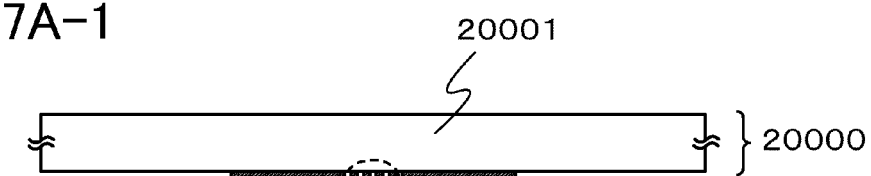
Figures 2, 37A:
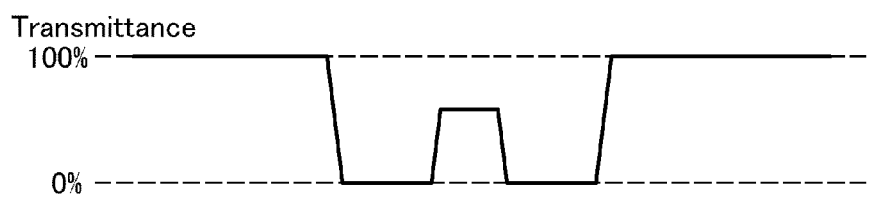
Figures 1, 37B:
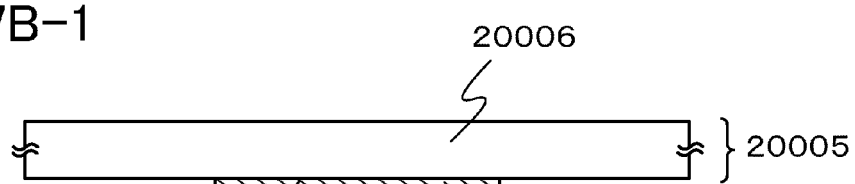
Figures 2, 37B:
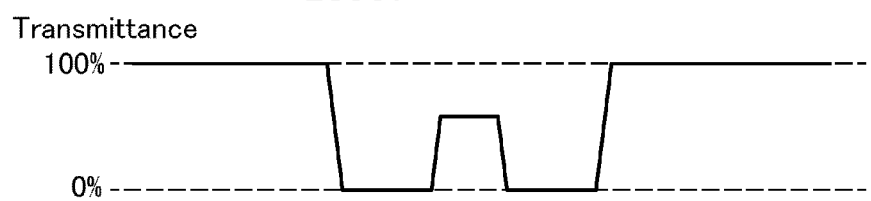

FIGS. 37A-1 and 37B-1 each are an example of a cross-sectional view of a multi-tone mask.

FIG. 37A-1 illustrates a gray-tone mask 20000 and FIG. 37B-1 illustrates a half-tone mask 20005.

The gray-tone mask 20000 illustrated in FIG. 37A-1 includes a light-blocking portion 20002 formed using a light-blocking film on a substrate 20001 having a light-transmitting property, and a diffraction grating portion 20003 provided with a pattern of the light-blocking film.

The transmittance of light is controlled at the diffraction grating portion 20003 in such a manner that slits, dots, mesh, or the like are provided at an interval equal to or less than the resolution limit of light used for light exposure.

For the substrate 20001 having a light-transmitting property, quartz or the like can be used.

The light-blocking film for forming the light-blocking portion 20002 and the diffraction grating portion 20003 may be formed using a metal film and preferably provided using chromium, chromium oxide, or the like.

In the case where the gray-tone mask 20000 is irradiated with light for light exposure, as illustrated in FIG. 37A-2, the transmittance of the region overlapping the light-blocking portion 20002 is 0%, and the transmittance of the region where neither the light-blocking portion 20002 nor the diffraction grating portion 20003 is provided is 100%.

Further, the transmittance of the diffraction grating portion 20003 can be adjusted in the range of approximately 10% to 70% depending on the interval of slits, dots, mesh, or the like of the diffraction grating.

The half-tone mask 20005 illustrated in FIG. 37B-1 includes a semi-light-transmitting portion 20007 formed using a semi-light-transmitting film on a substrate 20006 having a light-transmitting property, and a light-blocking portion 20008 formed using a light-blocking film.

The semi-light-transmitting portion 20007 can be formed using MoSiN, MoSi, MoSiO, MoSiON, CrSi, or the like.

The light-blocking portion 20008 may be formed using a metal film similar to that used for the light-blocking film of the gray-tone mask, and be preferably provided using chromium, chromium oxide, or the like.

In the case where the half-tone mask 20005 is irradiated with light for light exposure, as illustrated in FIG. 37B-2, the transmittance of the region overlapping the light-blocking portion 20008 is 0%, and the transmittance of the region where neither the light-blocking portion 20008 nor the semi-light-transmitting portion 20007 is provided is 100%.

Further, the transmittance of the semi-light-transmitting portion 20007 can be adjusted in the range of approximately 10% to 70% depending on the material or the like of the semi-light-transmitting portion 20007.

This embodiment can be combined with any of the other embodiments.

Embodiment 12

In a channel formation region, channel doping may be performed using an impurity for controlling a threshold value.

This embodiment can be combined with any of the other embodiments.

Embodiment 13

As a semiconductor device, there are various integrated circuits.

For example, display devices (such as liquid crystal display devices and electroluminescent display devices (light-emitting devices)), semiconductor devices for performing wireless communication through antennas (such as RFID tags, wireless tags, IC chips, wireless chips, noncontact signal processing devices, and semiconductor integrated circuit chips), and the like are given, but the integrated circuit is not limited to them.

This embodiment can be combined with any of the other embodiments.

This application is based on Japanese Patent Application serial no. 2009-057437 filed with Japan Patent Office on Mar. 11, in 2009, the entire contents of which are hereby incorporated by reference.

What is claimed is:

1. A semiconductor device, comprising:
a gate electrode;
a gate insulating layer provided over the gate electrode; and
a semiconductor layer which is provided over the gate insulating layer and includes an eaves portion, the eaves portion projecting beyond sides of the gate electrode,
wherein the semiconductor layer includes at least a channel formation region and an impurity region,
wherein the channel formation region is provided in a position which overlaps the gate electrode, and
wherein the impurity region is provided in the eaves portion.

2. The semiconductor device according to claim 1,
wherein a column electrode which is electrically separated from the gate electrode is provided under the gate insulating layer, and
wherein the column electrode is provided in a position which overlaps the impurity region.

3. The semiconductor device according to claim 1,
wherein the impurity region includes a first region formed in a position which overlaps the gate electrode and a second region formed in the eaves portion.

4. A semiconductor device, comprising:
a gate electrode;
a gate insulating layer provided over the gate electrode;

a semiconductor layer which is provided over the gate insulating layer and includes an eaves portion, the eaves portion projecting beyond sides of the gate electrode; and an impurity semiconductor layer provided over the semiconductor layer, wherein the impurity semiconductor layer is provided in a position which overlaps the eaves portion.

5. The semiconductor device according to claim 4, wherein a column electrode which is electrically separated from the gate electrode is provided under the gate insulating layer, and wherein the column electrode is provided in a position which overlaps the impurity semiconductor layer.

6. The semiconductor device according to claim 4, wherein the impurity semiconductor layer includes a first region formed in a position which overlaps the gate electrode and a second region formed in the eaves portion.

7. A semiconductor device, comprising:

a gate electrode;

a gate insulating layer provided over the gate electrode; and an oxide semiconductor layer which is provided over the gate insulating layer and includes an eaves portion, the eaves portion projecting beyond sides of the gate electrode, wherein the oxide semiconductor layer includes at least a channel formation region and an impurity region, wherein the channel formation region is provided in a position which overlaps the gate electrode, and wherein the impurity region is provided in the eaves portion.

8. The semiconductor device according to claim 7, wherein a column electrode which is electrically separated from the gate electrode is provided under the gate insulating layer, and wherein the column electrode is provided in a position which overlaps the impurity region.

9. The semiconductor device according to claim 7, wherein the impurity region includes a first region formed in a position which overlaps the gate electrode and a second region formed in the eaves portion.

10. A semiconductor device, comprising:

a gate electrode;

a gate insulating layer provided over the gate electrode;

an oxide semiconductor layer which is provided over the gate insulating layer and includes an eaves portion, the eaves portion projecting beyond sides of the gate electrode; and an impurity semiconductor layer provided over the oxide semiconductor layer, wherein the impurity semiconductor layer is provided in a position which overlaps the eaves portion.

11. The semiconductor device according to claim 10, wherein a column electrode which is electrically separated from the gate electrode is provided under the gate insulating layer, and wherein the column electrode is provided in a position which overlaps the impurity semiconductor layer.

12. The semiconductor device according to claim 10, wherein the impurity semiconductor layer includes a first region formed in a position which overlaps the gate electrode and a second region formed in the eaves portion.

* * * * *